US010840334B2

(12) United States Patent
Sriram et al.

(10) Patent No.: US 10,840,334 B2
(45) Date of Patent: Nov. 17, 2020

(54) GALLIUM NITRIDE HIGH-ELECTRON MOBILITY TRANSISTORS WITH DEEP IMPLANTED P-TYPE LAYERS IN SILICON CARBIDE SUBSTRATES FOR POWER SWITCHING AND RADIO FREQUENCY APPLICATIONS AND PROCESS FOR MAKING THE SAME

(71) Applicant: Cree, Inc., Durham, NC (US)

(72) Inventors: Saptharishi Sriram, Cary, NC (US); Thomas Smith, Raleigh, NC (US); Alexander Suvorov, Durham, NC (US); Christer Hallin, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/260,095

(22) Filed: Jan. 28, 2019

(65) Prior Publication Data

US 2019/0229187 A1 Jul. 25, 2019

Related U.S. Application Data

(63) Continuation-in-part of application No. 15/424,209, filed on Feb. 3, 2017, now Pat. No. 10,192,980, which
(Continued)

(51) Int. Cl.
*H01L 29/10* (2006.01)
*H01L 29/16* (2006.01)
(Continued)

(52) U.S. Cl.
CPC ........ *H01L 29/1087* (2013.01); *H01L 21/743* (2013.01); *H01L 21/746* (2013.01);
(Continued)

(58) Field of Classification Search
CPC ................. H01L 29/407; H01L 29/404; H01L 29/66462; H01L 29/7786; H01L 29/7787; H01L 29/778; H01L 29/66431
See application file for complete search history.

(56) References Cited

U.S. PATENT DOCUMENTS 6,956,239 B2 10/2005 Sriram
7,646,043 B2 1/2010 Sriram et al.
(Continued)

FOREIGN PATENT DOCUMENTS

| JP | 2006507683 A | 3/2006 |
| JP | 2012156320 A | 8/2012 |
| WO | 2015013620 A1 | 1/2015 |

OTHER PUBLICATIONS

Pal et al. "High elec tron Mobility transistor" IJSRET, vol. 1, issue. 1, Mar. 2012, pp. 043-046 (Year: 2012) [in related U.S. Appl. No. 15/192,545].
(Continued)

*Primary Examiner* — John A Bodnar
(74) *Attorney, Agent, or Firm* — BakerHostetler

(57) ABSTRACT

The disclosure is directed to a high-electron mobility transistor that includes a SiC substrate layer, a GaN buffer layer arranged on the SiC substrate layer, and a p-type material layer having a length parallel to a surface of the SiC substrate layer over which the GaN buffer layer is provided. The p-type material layer is provided in one of the following: the SiC substrate layer and a first layer arranged on the SiC substrate layer. A method of making the high-electron mobility transistor is also disclosed.

21 Claims, 12 Drawing Sheets

Related U.S. Application Data is a continuation-in-part of application No. 15/192,545, filed on Jun. 24, 2016.

(51) Int. Cl.
| | |
|---|---|
| *H01L 29/20* | (2006.01) |
| *H01L 29/205* | (2006.01) |
| *H01L 29/40* | (2006.01) |
| *H01L 29/788* | (2006.01) |
| *H01L 21/74* | (2006.01) |
| *H01L 29/66* | (2006.01) |
| *H01L 29/778* | (2006.01) |
| *H01L 29/417* | (2006.01) |

(52) U.S. Cl.
CPC ...... *H01L 29/1075* (2013.01); *H01L 29/1083* (2013.01); *H01L 29/1608* (2013.01); *H01L 29/2003* (2013.01); *H01L 29/205* (2013.01); *H01L 29/402* (2013.01); *H01L 29/66462* (2013.01); *H01L 29/7783* (2013.01); *H01L 29/7787* (2013.01); *H01L 29/1066* (2013.01); *H01L 29/41766* (2013.01)

(56) References Cited

U.S. PATENT DOCUMENTS

| | | | |
|---|---|---|---|
| 7,812,369 | B2 | 10/2010 | Chini et al. |
| 8,698,162 | B2 | 4/2014 | Lee et al. |
| 8,759,879 | B1 | 6/2014 | Tipirneni et al. |
| 9,337,332 | B2 | 5/2016 | Chu et al. |
| 2004/0099888 | A1 | 5/2004 | Sriram |
| 2004/0124435 | A1 | 7/2004 | D'Evelyn et al. |
| 2004/0149993 | A1 | 8/2004 | McClure et al. |
| 2005/0224809 | A1 | 10/2005 | Sriram |
| 2006/0125001 | A1 | 6/2006 | Sriram |
| 2007/0246713 | A1 | 10/2007 | Arnold et al. |
| 2007/0292999 | A1 | 12/2007 | Henning et al. |
| 2009/0120924 | A1 | 5/2009 | Moffatt et al. |
| 2011/0260174 | A1 | 10/2011 | Hebert |
| 2012/0153300 | A1 | 6/2012 | Lidow et al. |
| 2012/0187451 | A1* | 7/2012 | Saito ............ H01L 29/0623 257/192 |
| 2012/0217511 | A1 | 8/2012 | Renaud et al. |
| 2012/0319127 | A1 | 12/2012 | Chowdhury et al. |
| 2013/0049014 | A1 | 2/2013 | Aigo et al. |
| 2013/0153967 | A1 | 6/2013 | Curatola et al. |
| 2013/0221320 | A1 | 8/2013 | Li et al. |
| 2014/0117381 | A1 | 5/2014 | Kang et al. |
| 2014/0253241 | A1 | 9/2014 | Lee et al. |
| 2014/0264379 | A1* | 9/2014 | Kub ............ H01L 29/41725 257/77 |
| 2015/0028345 | A1* | 1/2015 | Wong ............ H01L 29/7787 257/76 |
| 2015/0145032 | A1 | 5/2015 | Quay et al. |
| 2015/0236146 | A1 | 8/2015 | Liu et al. |
| 2015/0318387 | A1 | 11/2015 | Chiu et al. |
| 2015/0372124 | A1* | 12/2015 | Isobe ............ H01L 29/2003 257/76 |
| 2016/0035870 | A1 | 2/2016 | Wu et al. |
| 2016/0071967 | A1 | 3/2016 | Prechtl et al. |
| 2017/0018638 | A1 | 1/2017 | Teo et al. |

OTHER PUBLICATIONS

Shailaja P. Rao, "Implant Annealing of al dopants in silicon carbide using silane overpressure", Scholar Commons, University of South Florida, 2005, pp. 21-22; Retrieved from http://scholarscommons.usf.edu/cgi/viewcontent.cgi?article=1828&context=e-td on Aug. 28, 2017 [Cited in related U.S. Appl. No. 15/424,209].

Wendt et al., "FIB Milling and Canneling" Nov. 1, 2008, Figure 1, p. 1; Retrieved from http://www.imaging-git.com/science/scanning-probe-microscopy/fib-milling-- and-canneling on Aug. 28, 2017 [Cited in related U.S. Appl. No. 15/424,209].

Danielsson et al., "Fabrication and Characterization of Heterojunction Diodes with HVPE-Grown GaN on 4H-SiC" IEEE Transactions on Electron Devices, vol. 48, No. 3, Mar. 2001, pp. 444-449 [Cited in related U.S. Appl. No. 15/424,209].

R. R. Pelá, C. Caetano, M. Marques, L. G. Ferreira, J. Furthmuller, and L. K. Teles, "Accurate band gaps of AlGaN, nGaN, and AllnN alloys calculations based on LDA-1/2 approach", Appl. Phys. Lett. 98, 151907 (2011) Appl. Phys. Lett. 98, 151907 (2011). (Year: 2011)

\* cited by examiner

GALLIUM NITRIDE HIGH-ELECTRON MOBILITY TRANSISTORS WITH DEEP IMPLANTED P-TYPE LAYERS IN SILICON CARBIDE SUBSTRATES FOR POWER SWITCHING AND RADIO FREQUENCY APPLICATIONS AND PROCESS FOR MAKING THE SAME

CROSS REFERENCE TO PRIOR APPLICATIONS

This application is a continuation in part of U.S. patent application Ser. No. 15/424,209, filed Feb. 3, 2017, now U.S. Pat. No. 10,192,980 that issued on Jan. 29, 2019, which is incorporated herein by reference in its entirety; which is a continuation in part of U.S. patent application Ser. No. 15/192,545, filed Jun. 24, 2016, which is incorporated herein by reference in its entirety.

FIELD OF THE DISCLOSURE

The disclosure relates to microelectronic devices and more particularly to gallium nitride high-electron mobility transistors with p-type layers. The disclosure also relates to a process of making microelectronic devices and more particularly to a process of making gallium nitride high-electron mobility transistors with p-type layers.

BACKGROUND OF THE DISCLOSURE

Gallium Nitride (GaN) based high-electron mobility transistors (HEMTs) are very promising candidates for high power radiofrequency (RF) applications, and also for low frequency high power switching applications since the material properties of GaN enable achievement of high voltage and high current. However, an important issue in these devices is the design of the buffer layer to achieve high voltage capability. Many designs currently use deep level impurities such as iron (Fe) or carbon (C) to minimize current flow through the buffer layer at high drain voltage conditions. However, both Fe and C lead to drain lag effect, which is the slow recovery of drain current when the drain voltage is changed from a high value to a lower one. This is very undesirable for both power and RF applications since it leads to lower switching current, lower efficiency, and other problems. The drain lag effect may be eliminated by using high purity buffer layers without Fe or C. However, these devices have high leakage current through the buffer layer which is also not acceptable.

Accordingly, there is a need for an alternative solution to addressing lag effect in GaN HEMTs.

SUMMARY OF THE DISCLOSURE

According to an aspect of this disclosure a high-electron mobility transistor includes a SiC substrate layer, a GaN buffer layer arranged on the SiC substrate layer, and a p-type material layer having a length parallel to a surface of the SiC substrate layer over which the GaN buffer layer is provided, where the p-type material layer is provided in one of the following: the SiC substrate layer and a first layer arranged on the SiC substrate layer.

According to another aspect of this disclosure a method of making a high-electron mobility transistor includes providing a SiC substrate layer, providing a GaN buffer layer on the SiC substrate layer, providing a p-type material layer having a length parallel to a surface of the SiC substrate layer over which the GaN buffer layer is provided, and providing the p-type material layer in one of the following: the SiC substrate layer and a first layer arranged on the SiC substrate layer.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
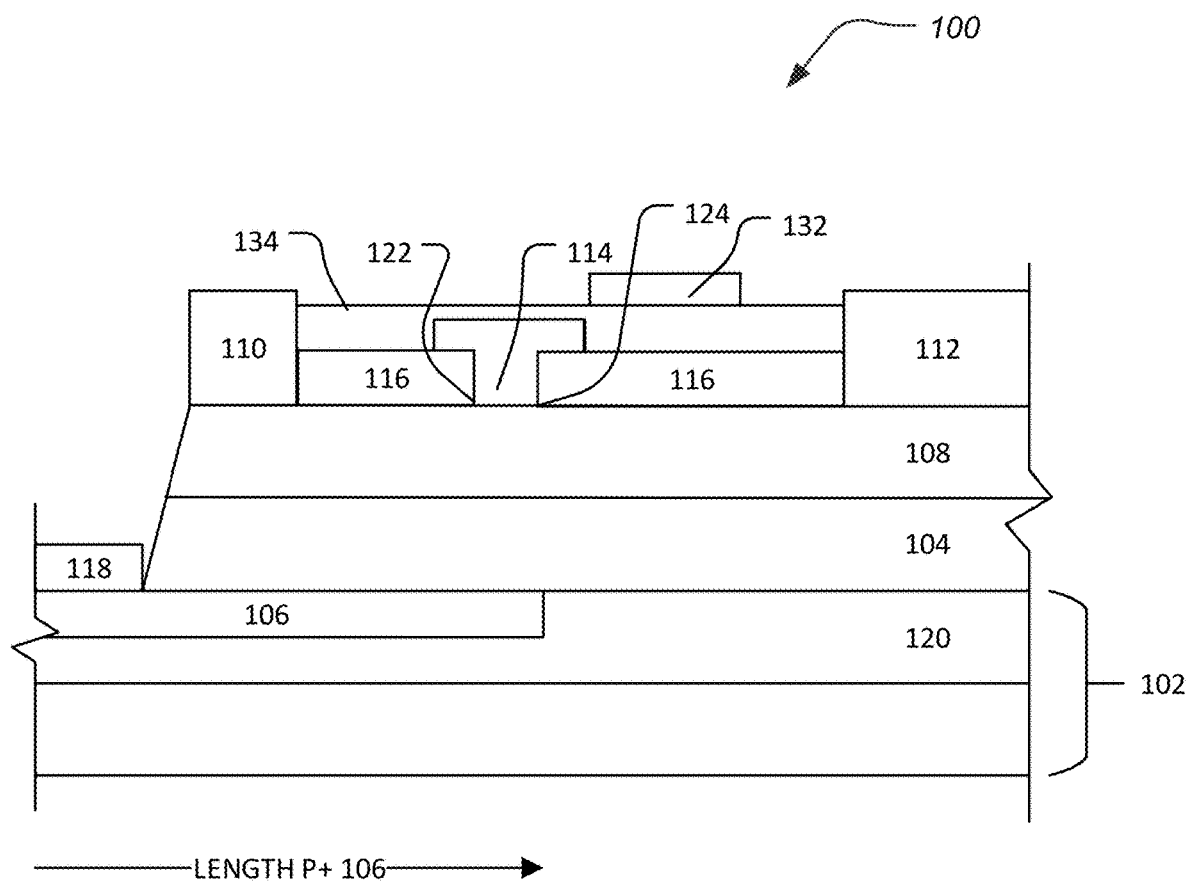
FIG. 1 shows a cross-sectional view of one aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the electron mobility, saturated electron drift velocity, electric breakdown field and thermal conductivity may have an effect on a transistor's high frequency and high power characteristics.

Electron mobility is the measurement of how rapidly an electron is accelerated to its saturated velocity in the presence of an electric field. In the past, semiconductor materials which had a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties which should theoretically allow production of electronic devices that can operate at higher temperatures, higher power, and higher frequency than devices produced from silicon (Si) or gallium arsenide (GaAs). The high electric breakdown field of about $4 \times E6$ V/cm, high saturated electron drift velocity of about $2.0 \times E7$ cm/sec and high thermal conductivity of about 4.9 W/cm-° K indicate that SiC would be suitable for high frequency and high power applications.

The drain lag in the disclosed GaN HEMTs is in some aspects addressed with the addition of structures. In these structures, a p-type layer is used to simultaneously achieve high breakdown, and no drain lag. The p-type layer helps in optimizing the breakdown voltage and can be charged and discharged easily which ensures absence of drain lag. In one aspect, the p-type layer is formed in a SiC substrate.

This approach overcomes two problems: 1. It is difficult to form p-type layers in GaN using ion-implantation. Selective ion-implantation enables optimization of the device structure by allowing different concentrations to be obtained in different regions. This can be more difficult with epitaxial growth. 2. P-type doping of GaN using magnesium (Mg) also exhibits memory effects which precludes the formation of abrupt interfaces.

The disclosed process and structure may enable development of GaN HEMTs with high voltage capability suitable for power switching without the adverse drain lag effects. The disclosed process and structure may also lead to more compact device structures (due to optimized field shaping) that will lower costs. Additionally, with proper design, the disclosed structures can also be applied to high power RF devices for telecommunication and other applications. An important advantage is the minimization of device memory effects, which is a serious problem for telecommunication applications.

Figure 2:
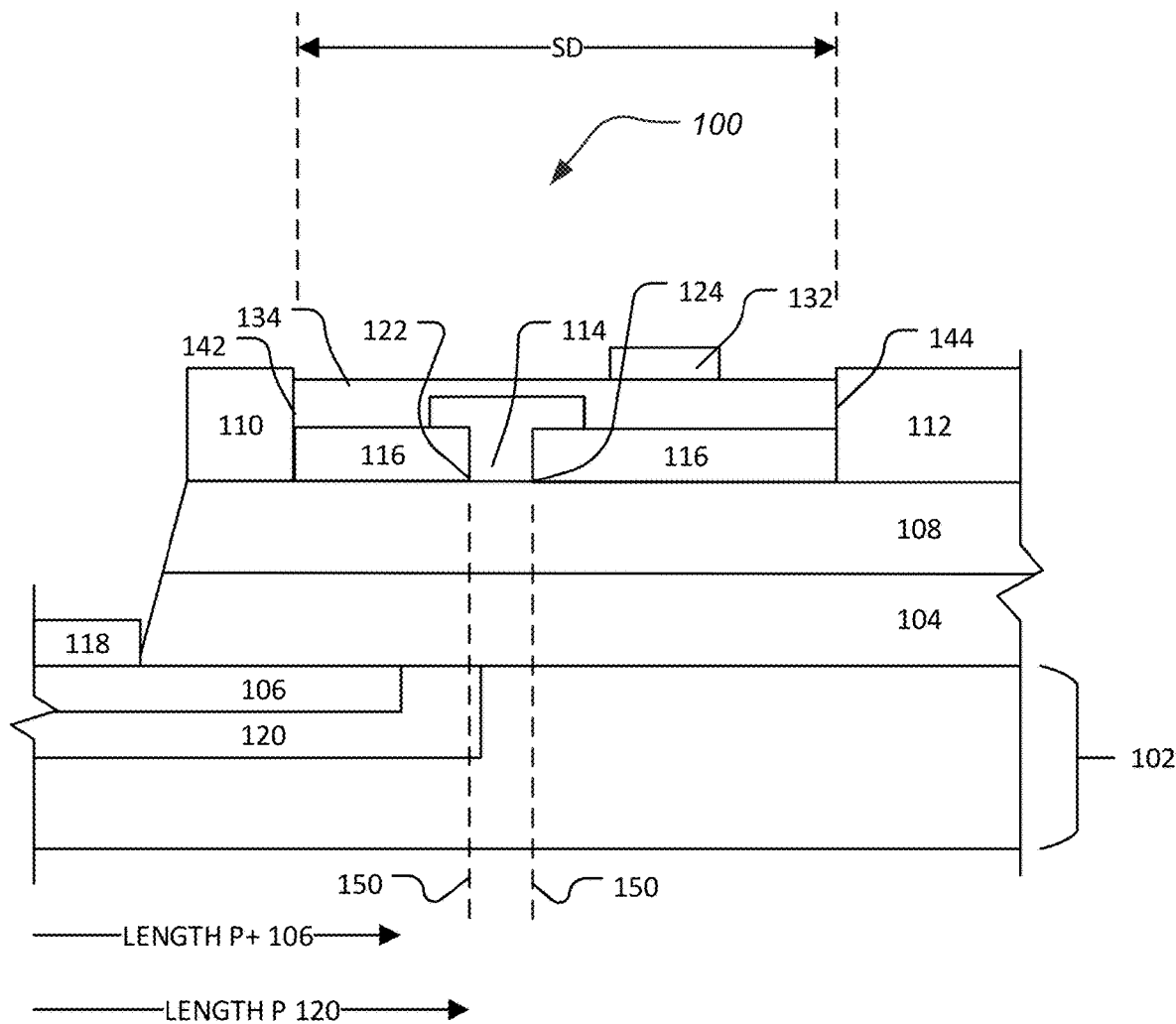
FIG. 2 shows a cross-sectional view of another aspect of a transistor according to the disclosure.

FIG. 1 shows a cross-sectional view of one aspect of a transistor according to the disclosure; and FIG. 2 shows a cross-sectional view of another aspect of a transistor according to the disclosure. In particular, FIG. 1 shows a cross-sectional view of a transistor 100. The transistor 100 may include a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. In one aspect, the substrate layer 102 may be formed of SiC selected from the group of 6H, 4H, 15R, 3C SiC, or the like.

In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

The substrate layer 102 may include a p-type material layer 120. The p-type material layer 120 may be formed by ion implantation of aluminum (Al) and annealing. In other aspects, the p-type material layer 120 may be formed by ion implantation of boron, gallium, or any other material that may form a p-type layer. In one aspect, the p-type material layer 120 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implanting efficiency.

Aspects of the disclosure are based on a realization that implant channeling can be used to controllably form implanted regions in silicon carbide that are highly uniform by depth using lower energy implants which result in reduced lattice damage. Channeling is experienced when ions are implanted along a crystal axis of a semiconductor. When a direction of implantation is close to a major axis of the crystal lattice, the atoms in the crystal lattice appear to "line up" relative to the direction of implantation, and the implanted ions appear to travel down the channels created by the crystal structure. This reduces the likelihood of collisions between the implanted ions and the atoms in the crystal lattice, especially near the surface of the semiconductor layer. As a result, the depth of the implant is greatly increased.

In general, channeling occurs in silicon carbide when the direction of implantation is within about 2° of a crystallographic axis of the silicon carbide crystal. When the direction of implantation is more than about 2° of a crystallographic axis of the silicon carbide crystal, the atoms in the lattice may appear to be randomly distributed relative to the direction of implantation, which may reduce channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer may be expected to result in channeling. However, other implant angles may be utilized as well.

In one aspect, the p-type material layer 120 may be formed by ion implantation of $^{27}Al$ in 4H-SiC implanted with channeling conditions with an implant energy of $E_1=100$ keV with a dose of 1E13 $cm^2$ at 25° C. In one aspect, the p-type material layer 120 may be formed by ion implantation of $^{27}Al$ in 4H-SiC implanted with channeling conditions with an implant energy of $E_2=300$ keV with a dose of 1E13 $cm^2$ at 25° C. However, other implant energies and doses are contemplated as well. For example, in some aspects the implant energy may be 20 keV to 80 keV, 80 keV to 120 keV, 120 keV to 160 keV, 160 keV to 200 keV, 200 keV to 240 keV, 240 keV to 280 keV, 280 keV to 340 keV, 340 keV to 400 keV, 20 keV to 400 keV, and/or 80 keV to 340 keV; and in some aspects the implant dose may be 0.6E13 $cm^2$ to 0.8E13 $cm^2$, 0.8E13 $cm^2$ to 1.2E13 $cm^2$, 1.2E13 $cm^2$ to 1.6E13 $cm^2$, 1.6E13 $cm^2$ to 2E13 $cm^2$, 0.6E13 $cm^2$ to 2E13 $cm^2$, and/or 0.8E13 $cm^2$ to 1.2E13 $cm^2$. Additionally, it should be noted that the p-type material layer 120 may be formed by implantation of other materials such as Boron (B), Gallium (Ga), and/or the like, and may be followed by a high temperature anneal.

In one aspect, the ion implantation may result in the p-type material layer 120 being a deep layer. In one aspect, the ion implantation may result in the p-type material layer 120 having a thickness of 1 μm or less. In one aspect, the ion implantation may result in the p-type material layer 120 having a thickness of 0.7 μm or less. In one aspect, the ion implantation may result in the p-type material layer 120 having a thickness of 0.5 μm or less. In one aspect, the ion implantation may result in the p-type material layer 120 having a thickness of 0.3 μm to 0.5 μm. In one aspect, the ion implantation may result in the p-type material layer 120 having a thickness of 0.2 μm to 0.6 μm. In one aspect, the ion implantation may result in the p-type material layer 120 having a thickness of 0.4 μm to 0.6 μm. In one aspect, the ion implantation may result in the p-type material layer 120 having a thickness of 0.6 μm to 0.8 μm. In one aspect, the ion implantation may result in the p-type material layer 120 having a thickness of 0.6 μm to 1.6 μm. In one aspect, the ion implantation may result in the p-type material layer 120 having a thickness of 0.6 μm to 2.1 μm. In one aspect, the ion implantation may result in the p-type material layer 120 having a thickness of 1 μm to 5 μm. In one aspect, the p-type material layer 120 implantation and/or doping may be in the range of 5E15 to 5E17 per $cm^3$ and extend to depths up to 5 μm. In one aspect, the ion implantation may result in the p-type material layer 120 having a thickness of 10% to 20% of a thickness of the substrate layer 102. In one aspect, the ion implantation may result in the p-type material layer 120 having a thickness of 20% to 30% of a thickness of the substrate layer 102. In one aspect, the ion implantation may result in the p-type material layer 120 having a thickness of 30% to 40% of a thickness of the substrate layer 102. In one aspect, the ion implantation may result in the p-type material layer 120 having a thickness of 40% to 50% of a thickness of the substrate layer 102. In one aspect, the ion implantation may result in the p-type material layer 120 having a thickness of 50% to 60% of a thickness of the substrate layer 102. In one aspect, the ion implantation may result in the p-type material layer 120 having a thickness of 60% to 70% of a thickness of the substrate layer 102. In one aspect, the ion implantation may result in the p-type material layer 120 having a thickness of 70% to 80% of a thickness of the substrate layer 102. In one aspect, the ion implantation may result in the p-type material layer 120 having a thickness of 80% to 90% of a thickness of the substrate layer 102.

The p-type material layer 120 may be implanted within the substrate layer 102 and may be subsequently annealed. Annealing may allow for the implantation to be activated. In one aspect, a masking layer material may be utilized during implantation. In some aspects, during annealing of the p-type material layer 120, a cap layer material may be used to cover the wafer surface to prevent dissociation of the substrate at high temperatures. Once the p-type material layer 120 has been formed, the masking layer material may be removed. Annealing may be performed at a temperature range of 1500-1850° C. for 5 minutes-30 minutes. Other annealing time and temperature profiles are contemplated as well.

In some aspects, the substrate layer 102 may be made of a p-type material SiC substrate. In this aspect, the p-type material layer 120 formation by implantation may not be necessary. Further in this aspect, the substrate layer 102 being a p-type material SiC substrate may be subsequently subjected to the processes as described herein including implantation of a p+ layer 106.

Figure 3:
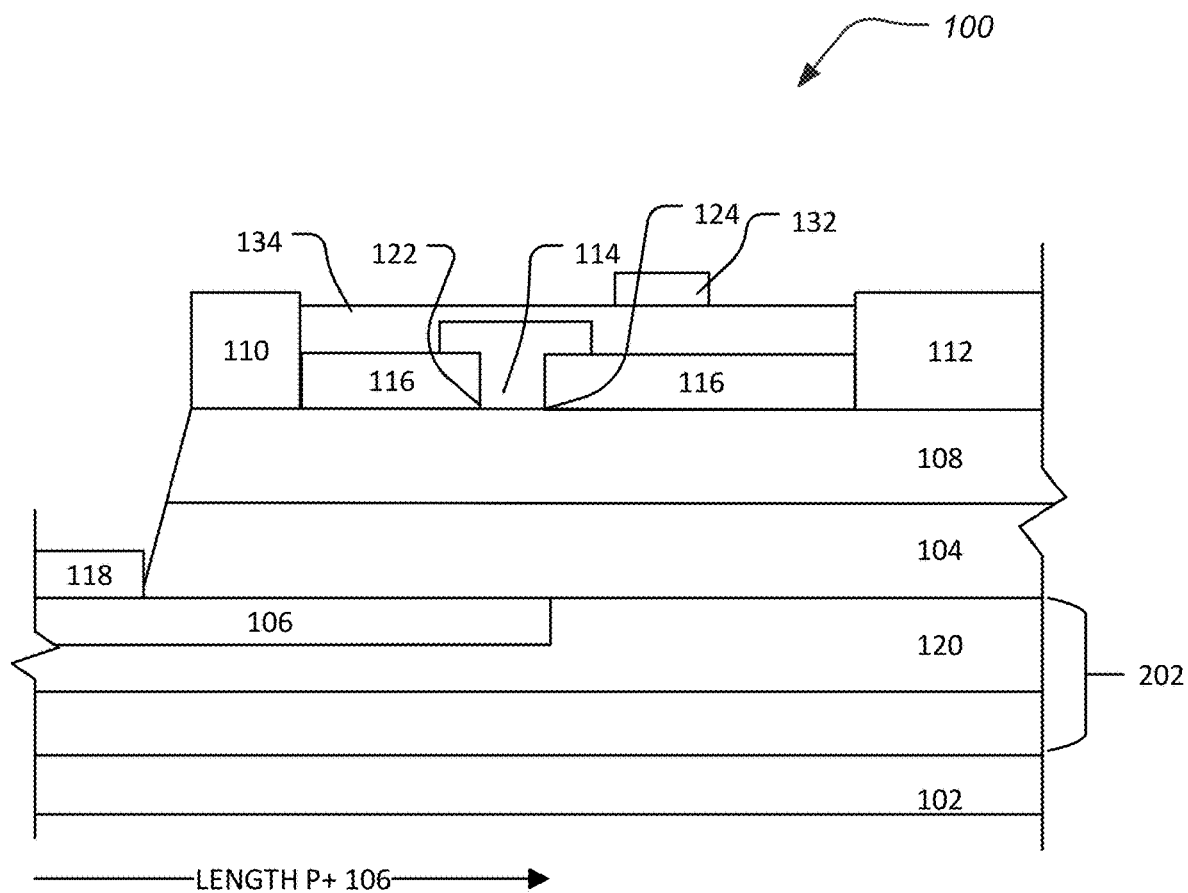
FIG. 3 shows a cross-sectional view of another aspect of a transistor according to the disclosure.
Figure 4:
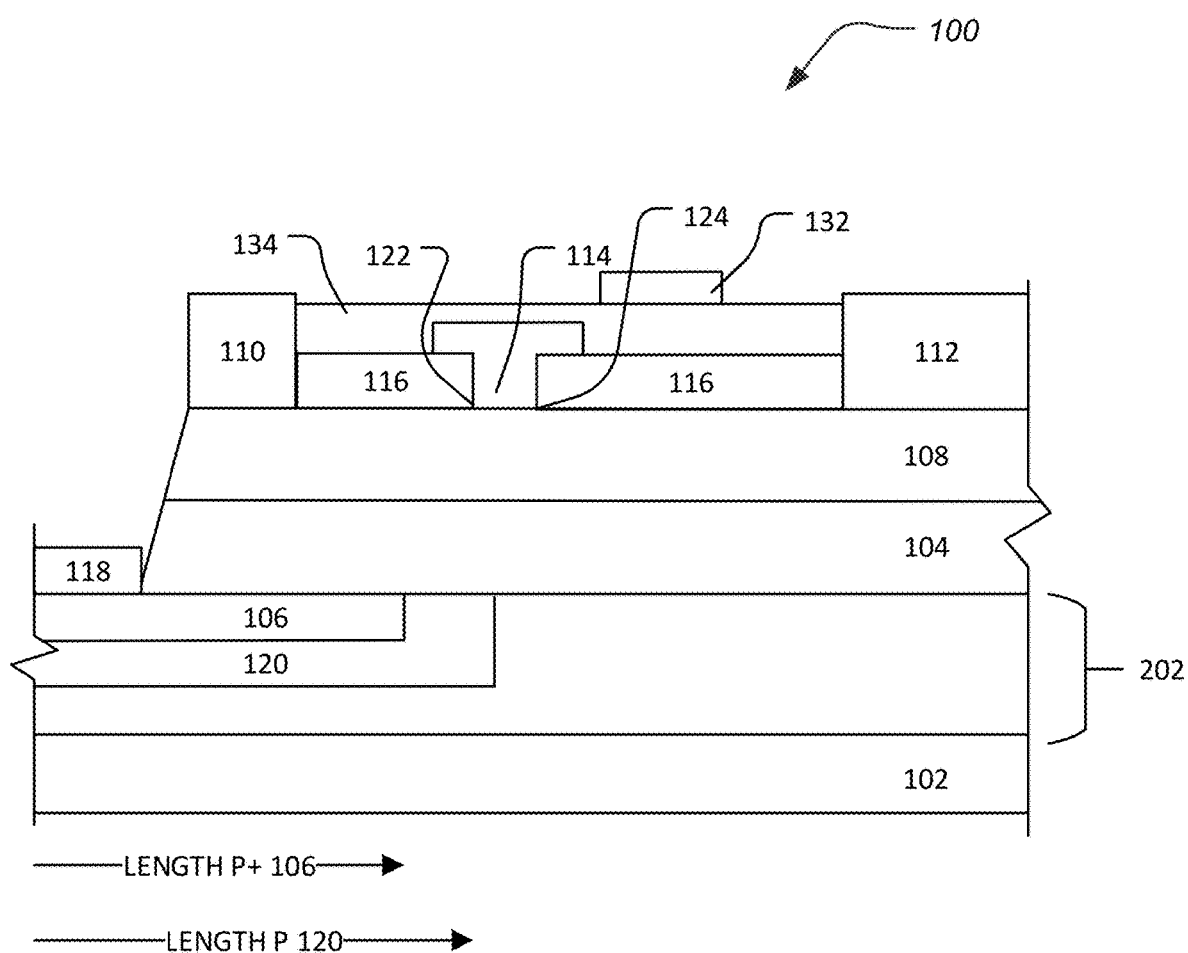
FIG. 4 shows a cross-sectional view of another aspect of a transistor according to the disclosure.

FIG. 3 shows a cross-sectional view of another aspect of a transistor according to the disclosure; and FIG. 4 shows a cross-sectional view of another aspect of a transistor according to the disclosure. As shown in FIG. 3 and FIG. 4, an epitaxial layer 202 may be formed on the substrate layer 102. In one aspect, an epitaxial layer 202 may be formed on the substrate layer 102. In one aspect, an epitaxial layer 202 may be formed directly on the substrate layer 102. In the aspects of FIG. 3 and FIG. 4, the p-type material layer 120 may be in the epitaxial layer 202. In some aspects, the p-type material layer 120 may be in the epitaxial layer 202 in certain aspects where the substrate layer 102 includes GaAs, GaN, or the like substrate materials.

In one aspect, the epitaxial layer 202 is formed of SiC. In some aspects, the p-type material layer 120 may be in the epitaxial layer 202 and may be SiC. In some aspects, the p-type material layer 120 may be in the epitaxial layer 202 and may be SiC and the p-type material layer 120 may include Al and/or Br. In some aspects, the p-type material layer 120 may be in the epitaxial layer 202 and may be SiC and the p-type material layer 120 may include implantation of Al and/or Br.

In some aspects, the p-type material layer 120 may be in the epitaxial layer 202. In some aspects, the p-type material layer 120 may be in the epitaxial layer 202 and may be GaN. In some aspects, the p-type material layer 120 may be in the epitaxial layer 202 and may be GaN and the p-type material layer 120 may include magnesium (Mg), carbon (C), and/or Zinc. In some aspects, the p-type material layer 120 may be in the epitaxial layer 202 and may be GaN and the p-type material layer 120 may include implantation of magnesium (Mg), carbon (C), and/or Zinc.

In one aspect, the epitaxial layer 202 may be arranged on top of the substrate layer 102. In one aspect, the epitaxial layer 202 may be arranged directly on top of the substrate layer 102. In one aspect, the buffer layer 104 may be arranged on top of the epitaxial layer 202. In one aspect, the buffer layer 104 may be arranged directly on top of the epitaxial layer 202. Thereafter, the p-type material layer 120 may be implanted within the epitaxial layer 202 and may be subsequently annealed as described herein. Further in this aspect, the epitaxial layer 202 may be subsequently subjected to processes as described herein and may include utilization and/or implantation of a p+ layer 106.

In one aspect, the ion implantation may result in the p-type material layer 120 having a thickness of 10% to 20% of a thickness of the epitaxial layer 202. In one aspect, the ion implantation may result in the p-type material layer 120 having a thickness of 20% to 30% of a thickness of the epitaxial layer 202. In one aspect, the ion implantation may result in the p-type material layer 120 having a thickness of 30% to 40% of a thickness of the epitaxial layer 202. In one aspect, the ion implantation may result in the p-type material layer 120 having a thickness of 40% to 50% of a thickness of the epitaxial layer 202. In one aspect, the ion implantation may result in the p-type material layer 120 having a thickness of 50% to 60% of a thickness of the epitaxial layer 202. In one aspect, the ion implantation may result in the p-type material layer 120 having a thickness of 60% to 70% of a thickness of the epitaxial layer 202. In one aspect, the ion implantation may result in the p-type material layer 120 having a thickness of 70% to 80% of a thickness of the epitaxial layer 202. In one aspect, the ion implantation may result in the p-type material layer 120 having a thickness of 80% to 90% of a thickness of the epitaxial layer 202.

In another aspect, the epitaxial layer 202 may utilize a p-type material and the epitaxial layer 202 may be arranged on top of the substrate layer 102. In another aspect, the epitaxial layer 202 may utilize a p-type material and the epitaxial layer 202 may be arranged directly on top of the substrate layer 102. In this regard, in certain aspects, a p-type material epitaxial layer 202 may be grown that results in an epitaxial layer 202 having the p-type material layer 120 and may not require implantation as described herein to form the p-type material layer 120. Thereafter, the epitaxial layer 202 may be subsequently subjected to the processes including implantation of a p+ layer 106 as described in further detail below. In some aspects, the epitaxial layer 202 may be formed by epitaxial growth utilizing off-axis oriented wafers.

Figure 5:
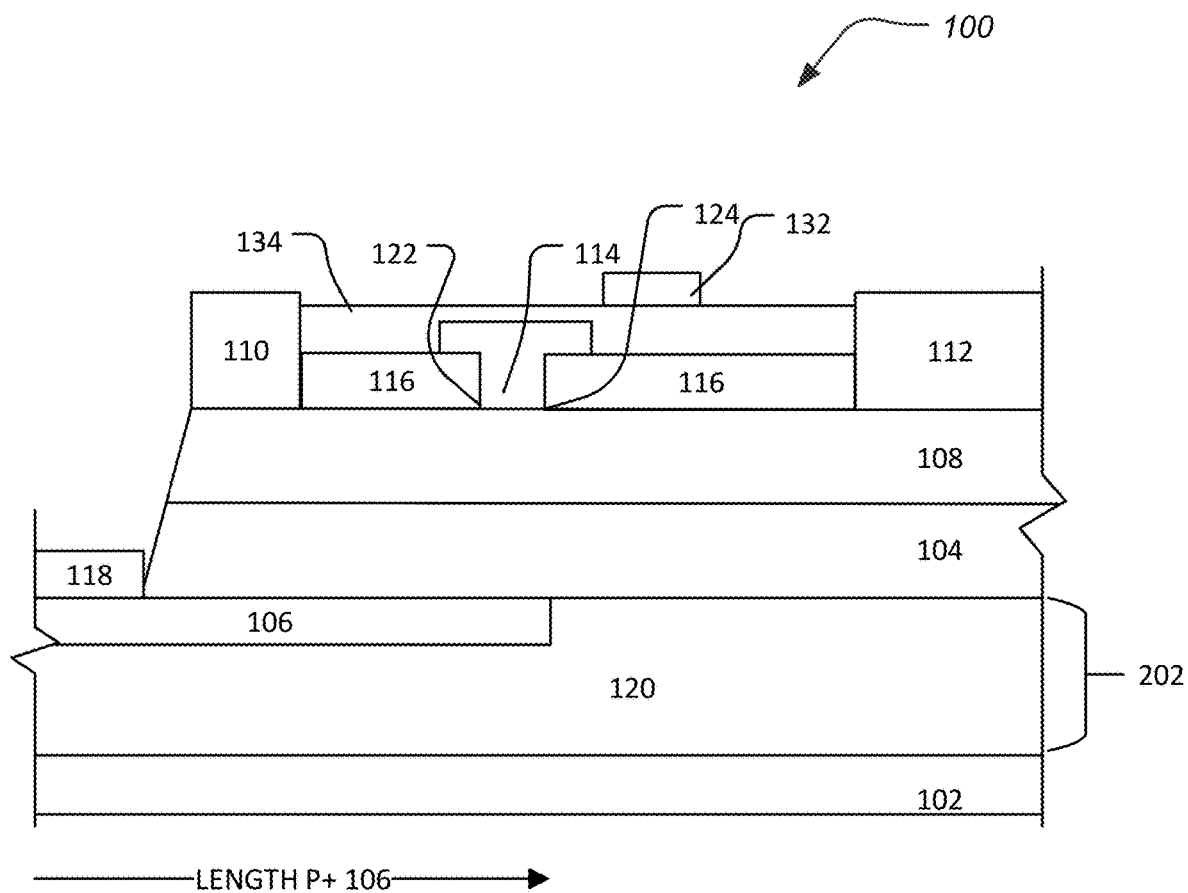
FIG. 5 shows a cross-sectional view of another aspect of a transistor according to the disclosure.

FIG. 5 shows a cross-sectional view of another aspect of a transistor according to the disclosure. In the FIG. 5 aspect, the epitaxial layer 202 may formed with a p-type material and the epitaxial layer 202 may be arranged on top of the substrate layer 102. In one aspect, the epitaxial layer 202 may formed with a p-type material and the epitaxial layer 202 may be arranged directly on top of the substrate layer 102. In this aspect, the entire epitaxial layer 202 may form the p-type material layer 120. Thereafter, the epitaxial layer 202 may be subsequently subjected to the processes including implantation of a p+ layer 106 as described in further detail below.

In some aspects, the p-type material layer 120 may also be configured to have a varying doping and/or implantation profile perpendicular to the surface. In some aspects, the p-type material layer 120 may also be configured to have a varying profile perpendicular to the surface extending into the cross-sectional views of FIGS. 1-7. The profile may be optimized to achieve desired breakdown voltage, device size, switching time, and the like.

In one aspect, the p-type material layer 120 may be present uniformly under the transistor 100 for certain applications as shown in FIG. 1 and FIG. 3. In one aspect, the p-type material layer 120 may be present uniformly under the transistor 100 for power switching applications as shown in FIG. 1 and FIG. 3.

In another aspect for certain applications, such as RF applications, the p-type material layer 120 may be located in limited areas such as in part of the gate—source region of the transistor 100 as illustrated in FIG. 2 and FIG. 4 and described in further detail below.

In some aspects, part of the voltage from a drain 112 to a source 110 may be dropped in the p-type material layer 120 region. This may also deplete the channel in the lateral direction. The lateral depletion may reduce the lateral field and increase breakdown voltage. Alternatively, a more compact structure can be obtained for a required breakdown voltage. The p-type material layer 120 may eliminate the need to have C or Fe doping of the buffer needed to sustain the applied drain voltage. Elimination of C and Fe deep levels leads to decreased current reduction under operating conditions (no trapping). Moreover, in some aspects the p-type material layer 120 may support the field.

In some aspects, the substrate layer 102 may include a p+ layer 106 as shown in FIG. 1 and FIG. 2. In some aspects, the epitaxial layer 202 may include a p+ layer 106 as shown in FIG. 3 and FIG. 4. The p+ layer 106 may be used to reduce charging time constants and to achieve contact formation. In some aspects, the p+ layer 106 may also be formed by ion-implantation and annealing. The p+ layer 106 may be doped as highly as possible with minimum achievable sheet resistance. In some aspects, the p+ layer 106 may be present in a gate—source region. In some aspects, the p+ layer 106 may be present in a gate—source region and also partly under the gate 114. In some aspects, the p+ layer 106 may be present in limited areas as described in further detail below. In some aspects, the p+ layer 106 may be under 0.3 μm in thickness. In some aspects, the p+ layer 106 may be under 0.2 μm in thickness. In some aspects, the p+ layer 106 may be between 0.1 and 0.3 μm in thickness. In some aspects, the p+ layer 106 may be between 0.05 and 0.25 μm in thickness. In some aspects, the p+ layer 106 may be between 0.15 and 0.25 μm in thickness.

On the substrate layer 102, a buffer layer 104, and/or a nucleation layer, may be formed. In one aspect, the buffer layer 104 is formed on the substrate layer 102. In one aspect, the buffer layer 104 is formed directly on the substrate layer 102. In one aspect, the nucleation layer is formed on the substrate layer 102. In one aspect, the nucleation layer is formed directly on the substrate layer 102. In one aspect, the epitaxial layer 202 may be arranged on top of the substrate layer 102 and the buffer layer 104 may be formed on the epitaxial layer 202. In one aspect, the epitaxial layer 202 may be arranged on top of the substrate layer 102 and the buffer layer 104 may be formed directly on the epitaxial layer 202. The buffer layer 104 may be GaN, Aluminum Gallium Nitride (AlGaN), Aluminum Nitride (AlN), a Group III-nitride such as $Al_xGa_yIn_{(1-x-y)}N$ (where $0<=x<=1$, $0<=y<=1$, $x+y<=1$), $Al_xIn_yGa_{1-x-y}N$ (where $0<=x<=1$ and $0<=y<=1$), and the like, or another suitable material and may also include a nucleation layer of AlN. In one aspect, the buffer layer 104 is formed of AlGaN. The buffer layer 104 may be a p-type material, or alternatively can be undoped. In one aspect, an AlN nucleation layer may be used to adhere to the substrate layer 102 and may help grow the buffer layer 104. The buffer layer 104 may bind to the substrate layer 102. In one aspect, the nucleation layer may be AlGaN. In one aspect, the nucleation layer may be a Group III-nitride.

In one aspect, the buffer layer 104 may be high purity GaN. In one aspect, the buffer layer 104 may be high purity GaN that may be a low-doped n-type. In one aspect, the buffer layer 104 may also use AlGaN back barrier to achieve better electron confinement.

Figure 6:
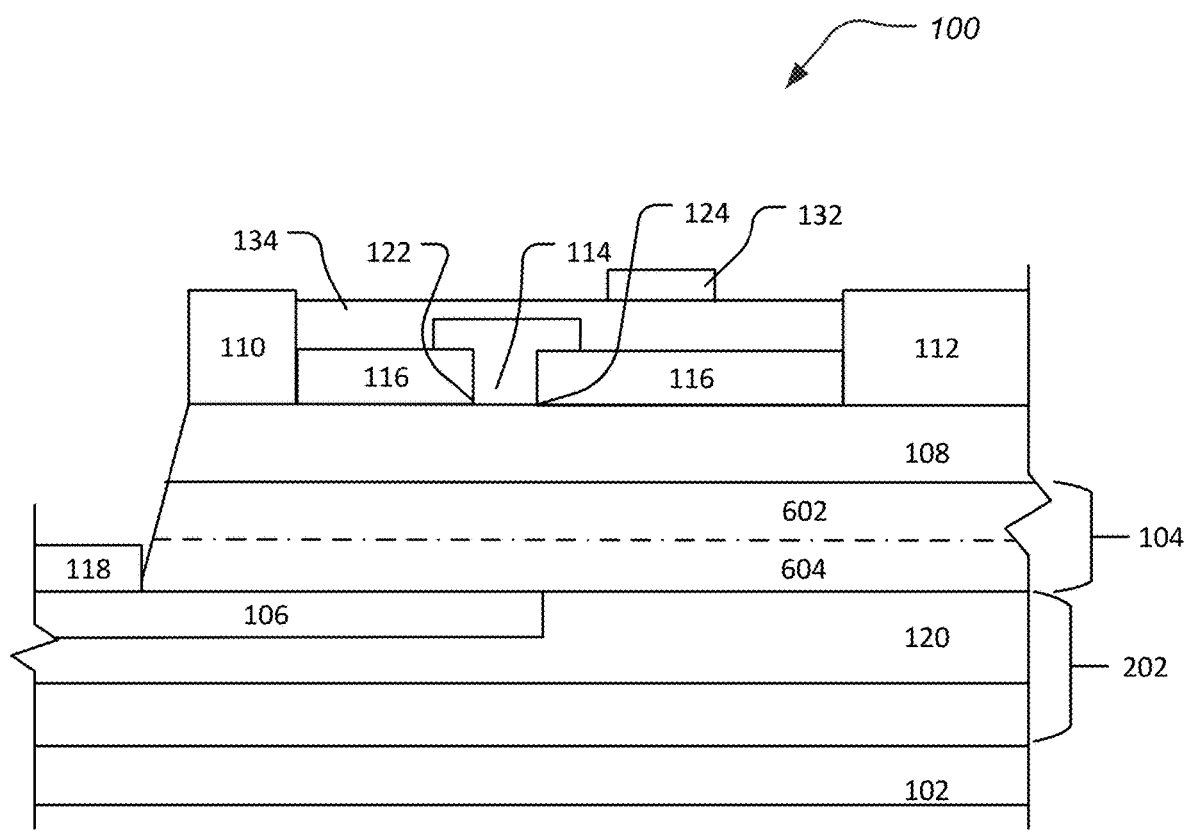
FIG. 6 shows a cross-sectional view of another aspect of a transistor according to the disclosure.

FIG. 6 shows a cross-sectional view of another aspect of a transistor according to the disclosure. In particular, the FIG. 6 aspect illustrates that the buffer layer 104 may include an upper portion 602 of high purity GaN and the buffer layer 104 may also include a lower portion 604 that may form an AlGaN back barrier to achieve better electron confinement. In one aspect, the lower portion 604 that forms the back barrier may be AlGaN of n type. The back barrier construction may be implemented in any of the aspects of the disclosure.

In one aspect, the buffer layer 104 may be designed to be of the high purity type where the Fermi level is in the upper half of the bandgap, which minimizes slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 μm layers with good quality.

In some aspects, a $Al_zGa_{1-z}N$ ($0<=z<=1$) nucleation layer or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer may depend on the material of the substrate layer 102.

In another aspect, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

On the buffer layer 104, a barrier layer 108 may be formed. In one aspect, the barrier layer 108 may be formed directly on the buffer layer 104. The barrier layer 108 may provide an additional layer between the buffer layer 104 and a source 110, a drain 112, and a gate 114. The barrier layer 108 may be AlGaN, AlN, a Group III-nitride, InAlGaN, or another suitable material. In one aspect, the barrier layer 108 may be AlGaN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In one aspect, a bandgap of the buffer layer 104 may be less than a bandgap of the barrier layer 108.

In one aspect, the source 110 and/or drain 112 may be connected directly to the barrier layer 108. In one aspect, the source 110 and/or drain 112 may be connected indirectly to the barrier layer 108.

To protect and separate the gate 114 and the drain 112, a protective layer 116 may be arranged on the barrier layer 108, on a side opposite the buffer layer 104, adjacent the gate 114 and the drain 112. The protective layer 116 may be a passivation layer made of SiN, AlO, SiO, $SiO_2$, AlN, or the like, or a combination incorporating multiple layers thereof. In one aspect, the protective layer 116 is a passivation layer made of SiN. In one aspect, the protective layer 116 can be deposited using MOCVD, plasma chemical vapor deposition (CVD), hot-filament CVD, or sputtering. In one aspect, the protective layer 116 may include deposition of $Si_3N_4$. In one aspect, the protective layer 116 forms an insulating layer. In one aspect, the protective layer 116 forms an insulator. In one aspect, the protective layer 116 may be a dielectric.

In one aspect, the source 110 may have a p-type material contact 118 on the p+ layer 106. The p-type material contact 118 may be formed on the p+ layer 106 in a recess provided in the buffer layer 104 and the barrier layer 108. The p-type material contact 118 may be electrically coupled to the p+ layer 106. The recess may extend down to the p+ layer 106 to allow for the p-type material contact 118 to be created there. The recess may be formed by etching, and may also use a material to define the recess. The material may be removed after the recess has been created.

In one aspect, the source 110 may have a p-type material contact 118 on the p-type material layer 120. The p-type material contact 118 may be formed on the p-type material layer 120 in a recess provided in the buffer layer 104 and the barrier layer 108. The p-type material contact 118 may be electrically coupled to the p-type material layer 120. The recess may extend down to the p-type material layer 120 to allow for the p-type material contact 118 to be created there. The recess may be formed by etching, and may also use a material to define the recess. The material may be removed after the recess has been created.

In some aspects, implantation of the p-type material layer 120 may expand the entire length of the transistor 100 as shown in FIG. 1 and FIG. 3. In some aspects, implantation of the p-type material layer 120 may partially extend the length of the transistor 100 as shown in FIG. 2 and FIG. 4.

In some aspects, the p-type material layer 120 may be neutralized to limit the length of the p-type material layer 120. In one aspect, neutralizing may include implantation of impurities. In one aspect, neutralizing the p-type material layer 120 may include absorbing the charge of the p-type material layer 120 with a material of opposite polarity. Another way to limit the length of the p-type material layer 120 may be to etch the p-type material layer 120. Another way to limit the length of the p-type material layer 120 may be to use a masking material to limit the area for implantation.

In another aspect, the p-type material layer 120 may be formed by growing the p-type material layer 120. Growth may be epitaxial, for example. To limit the length of the p-type material layer 120, the p-type material layer 120 may be etched or otherwise neutralized.

In one aspect, the substrate layer 102 may be etched and the p-type material layer 120 may be formed by growing the p-type material layer 120. In one aspect, the growth may be epitaxial.

In one aspect, the p-type material layer 120 may be an epitaxial layer formed of SiC. In some aspects, the p-type material layer 120 may be an epitaxial layer and may be SiC and the p-type material layer 120 may include Al and/or Br. In some aspects, the p-type material layer 120 may be an epitaxial layer and may be SiC and the p-type material layer 120 may include implantation of Al and/or Br.

In some aspects, the p-type material layer 120 may be an epitaxial layer and may be GaN. In some aspects, the p-type material layer 120 may be an epitaxial layer and may be GaN and the p-type material layer 120 may include magnesium (Mg), carbon (C), and/or Zinc. In some aspects, the p-type material layer 120 may be an epitaxial layer and may be GaN and the p-type material layer 120 may include implantation of magnesium (Mg), carbon (C), and/or Zinc.

In one aspect, the substrate layer 102 may be etched and the p+ layer 106 may be formed by growing the p+ layer 106. In one aspect, the growth may be epitaxial.

In one aspect, the p+ layer 106 may be an epitaxial layer formed of SiC. In some aspects, the p+ layer 106 may be an epitaxial layer and may be SiC and the p+ layer 106 may include Al and/or Br. In some aspects, the p+ layer 106 may be an epitaxial layer and may be SiC and the p+ layer 106 may include implantation of Al and/or Br.

In some aspects, the p+ layer 106 may be an epitaxial layer and may be GaN. In some aspects, the p+ layer 106 may be an epitaxial layer and may be GaN and the p+ layer 106 may include magnesium (Mg), carbon (C), and/or Zinc. In some aspects, the p+ layer 106 may be an epitaxial layer and may be GaN and the p+ layer 106 may include implantation of magnesium (Mg), carbon (C), and/or Zinc.

In one aspect, the substrate layer 102 may be silicon carbide and include a carbon face. In one aspect, the substrate layer 102 may be silicon carbide and include a carbon face arranged adjacent the buffer layer 104. In one aspect, the substrate layer 102 may be silicon carbide and include a carbon face and the substrate layer 102 may be flipped so as to be arranged adjacent the buffer layer 104. In this aspect, the buffer layer 104 may be GaN having a nitrogen face adjacent the carbon face of the substrate layer 102. In one aspect, the buffer layer 104 may be GaN having alternating GaN and N layers with a N layer and/or a nitrogen face adjacent the carbon face of the substrate layer 102.

In one aspect, the buffer layer 104 may include nonpolar GaN. In one aspect, the buffer layer 104 may include semipolar GaN. In one aspect, the buffer layer 104 may include hot wall epitaxy. In one aspect, the buffer layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns. The p-type material layer 120 may help avoid breakdowns and problems with material impurities. For example, without a p-type material layer 120, the transistor 100 may need impurities which do not discharge well. The p-type material layer 120 may be formed beneath the source 110, and may extend toward the gate 114 of the device.

In one aspect, the p-type material layer 120 may extend the entire length and remain as shown in FIGS. 1 and 3. In one aspect, the p-type material layer 120 may generally extend the entire length and remain as shown in FIGS. 1 and 3. In one aspect, the p-type material layer 120 may substantially extend the entire length and remain as shown in FIGS. 1 and 3.

In another aspect of the disclosure, the p-type material layer 120 may not extend over the entire area of the transistor 100 as shown by the arrow LENGTH P 120 as shown in FIGS. 2 and 4. In this regard, the p-type material layer 120 may be selectively arranged as described in detail below, the p-type material layer 120 may be arranged over the entire length and selectively removed as described in detail below, the p-type material layer 120 may be arranged over the entire length and selectively electrically neutralized as described in detail below, or the like. Accordingly, the specific constructions of the p-type material layer 120 described below encompass any of these processes that result in the p-type material layer 120 having an operating construction and arrangement as noted below. In other words, the length and/or size of the p-type material layer 120 does not include a part that is partially electrically neutralized, partially etched, or the like. The length and/or size of the p-type material layer 120 may depend on the application of the transistor 100, requirements for the transistor 100, and the like. Limiting the p-type material layer 120 so that it does not extend beyond the gate 114 avoids adverse effects on RF performance for certain transistor applications.

With reference to the aspects further described below, the p-type material layer 120 may extend horizontally parallel to the arrow LENGTH P 120. Moreover, the p-type material layer 120 may extend horizontally parallel to the arrow LENGTH P 120 to a point defined by a line that is perpendicular to the arrow LENGTH P 120 and extends through a component of the transistor 100 as illustrated.

In one aspect, of the disclosure, the p-type material layer 120 may extend laterally from at least beneath the source 110 toward a first edge 124 of the gate 114. In one aspect, of the disclosure, the p-type material layer 120 may extend laterally from at least beneath the source 110 to a position beneath a first edge 124 of the gate 114.

In certain aspects of the disclosure, the p-type material layer 120 may extend horizontally to a point within about 0 to about 0.7 μm of the first edge 124 of the gate 114. In certain aspects of the disclosure, the p-type material layer 120 may extend horizontally to a point within about 0 to about 0.5 μm of the first edge 124 of the gate 114. In certain aspects of the disclosure, the p-type material layer 120 may extend horizontally to a point within about 0 to about 0.3 μm of the first edge 124 of the gate 114. In one aspect, of the disclosure, the p-type material layer 120 may extend horizontally from at least beneath the source 110 to a position beneath a second edge 122 of the gate 114. In certain aspects of the disclosure, the p-type material layer 120 may extend horizontally to a point within about 0 to about 0.7 μm of the second edge 122 of the gate 114. In certain aspects of the disclosure, the p-type material layer 120 may extend horizontally to a point within about 0 to about 0.5 μm of the second edge 122 of the gate 114. In certain aspects of the disclosure, the p-type material layer 120 may extend horizontally to a point within about 0 to about 0.3 μm of the second edge 122 of the gate 114.

In other aspects, a length of the p-type material layer 120 LENGTH P 120 can be seen in relation to positions and/or lengths of other components. A length SD may be the length between an inner edge 142 of the source 110 and an inner edge 144 of the drain 112 as shown in FIG. 2 by lines 150.

In one aspect, the length of the p-type material layer 120 may extend from 10% to 20% of the length of SD, meaning the p-type material layer 120 may extend 10% to 20% past the inner edge 142 of the source 110 toward the drain 112. In one aspect, the length of the p-type material layer 120 may extend from 20% to 30% of the length of SD, meaning the p-type material layer 120 may extend 20% to 30% past the inner edge 142 of the source 110 toward the drain 112. In one aspect, the length of the p-type material layer 120 may extend from 30% to 40% of the length of SD, meaning the p-type material layer 120 may extend 30% to 40% past the inner edge 142 of the source 110 toward the drain 112. In one aspect, the length of the p-type material layer 120 may extend from 40% to 50% of the length of SD, meaning the p-type material layer 120 may extend 40% to 50% past the inner edge 142 of the source 110 toward the drain 112. In one aspect, the length of the p-type material layer 120 may extend from 50% to 60% of the length of SD, meaning the p-type material layer 120 may extend 50% to 60% past the inner edge 142 of the source 110 toward the drain 112.

In one aspect, of the present disclosure, the p+ layer 106 may not extend over the entire area of the substrate layer 102 as shown by the arrow LENGTH P+106 as shown in FIGS. 1-7. In this regard, the p+ layer 106 may be selectively arranged as described in detail below, the p+ layer 106 may be arranged over the entire length and selectively removed as described in detail below, the p+ layer 106 may be arranged over the entire length and selectively electrically neutralized as described in detail below, or the like. Accordingly, the specific constructions of the p+ layer 106 described below encompass any of these configurations that result in the p+ layer 106 having an operating construction and arrangement as noted below. In other words, the length and/or size of the p+ layer 106 does not include a part that is partially electrically neutralized or partially etched. The length and/or size of the p+ layer 106 may depend on the application of the transistor 100, requirements for the transistor 100, and the like.

With reference to the aspects further described below, the p+ layer 106 may extend horizontally parallel to the arrow LENGTH P+106. Moreover, the p+ layer 106 may extend horizontally parallel to the arrow LENGTH P+106 to a point defined by a line that is perpendicular to the arrow LENGTH P+106 and extends through a component of the transistor 100 as illustrated.

In certain aspects of the disclosure, the p+ layer 106 may extend to a point within about 0 to about 0.7 μm of the first edge 124 of the gate 114. In certain aspects of the disclosure, the p+ layer 106 may extend to a point within about 0 to about 0.5 μm of the first edge 124 of the gate 114. In certain aspects of the disclosure, the p+ layer 106 may extend to a point within about 0 to about 0.3 μm of the first edge 124 of the gate 114. In one aspect, of the disclosure, the p+ layer 106 may extend laterally from at least beneath the source 110 to a position beneath a second edge 122 of the gate 114. In certain aspects of the disclosure, the p+ layer 106 may extend to a point within about 0 to about 0.7 μm of the second edge 122 of the gate 114. In certain aspects of the disclosure, the p+ layer 106 may extend to a point within about 0 to about 0.5 μm of the second edge 122 of the gate 114. In certain aspects of the disclosure, the p+ layer 106 may extend to a point within about 0 to about 0.3 μm of the second edge 122 of the gate 114.

In other aspects, a length of the p+ layer 106 LENGTH P+106 can also be seen in relation to positions and/or lengths of other components based on the length SD as illustrated in FIG. 2. The length SD in this case may be the length between an inner edge 142 of the source 110 toward an inner edge 144 of the drain 112 as shown in FIG. 2.

In one aspect, the length of the p+ layer 106 may extend from 10% to 20% of the length of SD, meaning the p+ layer 106 may extend 10% to 20% past the inner edge 142 of the source 110 toward the drain 112. In one aspect, the length of the p+ layer 106 may extend from 20% to 30% of the length of SD, meaning the p+ layer 106 may extend 20% to 30% past the inner edge 142 of the source 110 toward the drain 112. In one aspect, the length of the p+ layer 106 may extend from 30% to 40% of the length of SD, meaning the p+ layer 106 may extend 30% to 40% past the inner edge 142 of the source 110 toward the drain 112. In one aspect, the length of the p+ layer 106 may extend from 40% to 50% of the length of SD, meaning the p+ layer 106 may extend 40% to 50% past the inner edge 142 of the source 110 toward the drain 112. In one aspect, the length of the p+ layer 106 may extend from 50% to 60% of the length of SD, meaning the p+ layer 106 may extend 50% to 60% past the inner edge 142 of the source 110 toward the drain 112. In one aspect, the length of the p+ layer 106 may extend from 60% to 70% of the length of SD, meaning the p+ layer 106 may extend 60% to 70% past the inner edge 142 of the source 110 toward the drain 112. In one aspect, the length of the p+ layer 106 may extend from 70% to 80% of the length of SD, meaning the p+ layer 106 may extend 70% to 80% past the inner edge 142 of the source 110 toward the drain 112.

A gate contact may be provided for the gate 114 in between the source 110 and the drain 112. Furthermore, in certain aspects of the disclosure, the gate contact may be disposed on the barrier layer 108. In one aspect, the gate contact may be disposed directly on the barrier layer 108.

The gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three layer structure. Such a structure may have advantages because of the high adhesion of some materials. In one aspect, the gate 114 may further include an overlayer of highly conductive metal. In one aspect, the gate 114 may be configured as a T-shaped gate.

A field plate 132 may be arranged on top of another protective layer and may be separated from the gate 114. The field plate 132 may be electrically connected to the source 110 and may also be referred to as a source connected field plate.

In another aspect, one or more metal overlayers may be provided on one or more of the source 110, the p-type material contact 118, the drain 112, and the gate 114. The overlayers may be Au, Silver (Ag), Al, Pt, Ti, Si, Ni, Al, and/or Copper (Cu). Other suitable highly conductive metals may also be used for the overlayers. In one or more aspects, the metal overlayer may electrically couple to the p-type material contact 118. In another aspect, the source 110, the p-type material contact 118, the drain 112, and the gate 114 may include Au, Silver (Ag), Al, Pt, Ti, Si, Ni, Al, and/or Copper (Cu). Other suitable highly conductive metals may also be used.

Figure 7:
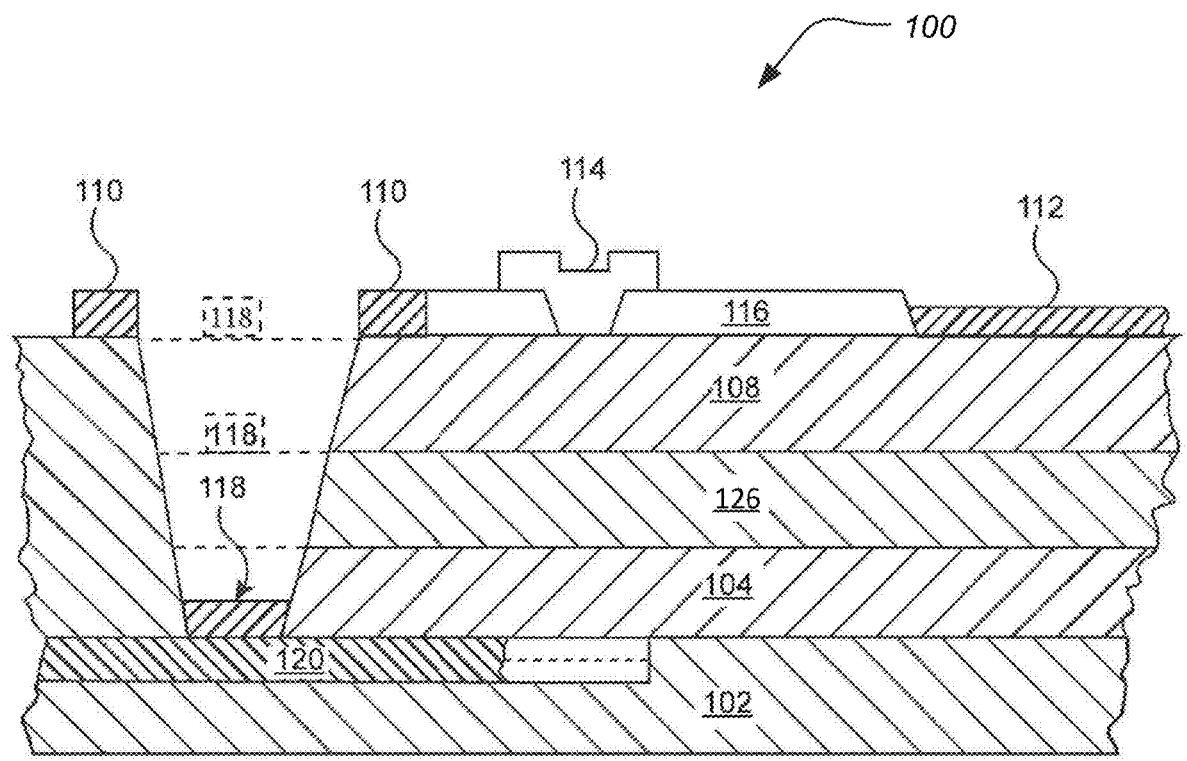
FIG. 7 shows a cross-sectional view of another aspect of a transistor according to the disclosure.

FIG. 7 shows a cross-sectional view of another aspect of a transistor according to the disclosure. In the FIG. 7 aspect, the p-type material layer 120 may be formed in or on the substrate layer 102 and the transistor 100 may include a second buffer layer 126. While FIG. 7 illustrates the transistor 100 with the first buffer layer 104 and the second buffer layer 126, the transistor 100 may also use only one buffer layer 104. In one aspect, to form the p-type material layer 120 in the substrate layer 102, Al may be implanted in the substrate layer 102 and annealed. In one aspect, the substrate layer 102 may be doped with the p-type material layer 120. In one aspect, the substrate layer 102 may be boron doped to form the p-type material layer 120. Other materials are contemplated as well including Ga. The length of the p-type material layer 120 near the surface of the p-type material layer 120 can be limited using the techniques described in other aspects above.

In one aspect, the second buffer layer 126 may be deposited or grown on the first buffer layer 104 on a side of the first buffer layer 104 opposite of the substrate layer 102. In one aspect, the second buffer layer 126 is formed directly on the first buffer layer 104. In one aspect, the second buffer layer 126 may be a high-purity material such as Gallium Nitride (GaN), AlN, or the like. In one aspect, the second buffer layer 126 may be a high-purity GaN. In one aspect, the second buffer layer 126 may be a high-purity AlN. The second buffer layer 126 may be a p-type material or n-type material. In another aspect, the second buffer layer 126 may be undoped.

In some aspects, the contacts of the source 110, the gate 114, and/or the drain 112 may include Al, Ti, Si, Ni, and/or Pt. In some aspects, the p-type material contact 118 may include Al, Ti, Si, Ni, and/or Pt. In particular aspects, the material of the contacts of the source 110, the gate 114, and/or the drain 112 may be the same material as the p-type material contact 118. In this aspect, utilizing the same material may be beneficial in that manufacturing may be easier, simplified, and/or less costly. In other aspects, the material of the contacts of the source 110, the gate 114, the drain 112, and the p-type material contact 118 may be different.

In one aspect, the p+ layer 106 may be a graded layer. In one aspect, the p+ layer 106 may be a step graded layer. In one aspect, the p+ layer 106 may be multiple layers. In one aspect, the p-type material layer 120 may be a graded layer. In one aspect, the p-type material layer 120 may be a step graded layer. In one aspect, the p-type material layer 120 may be multiple layers.

Figure 8:
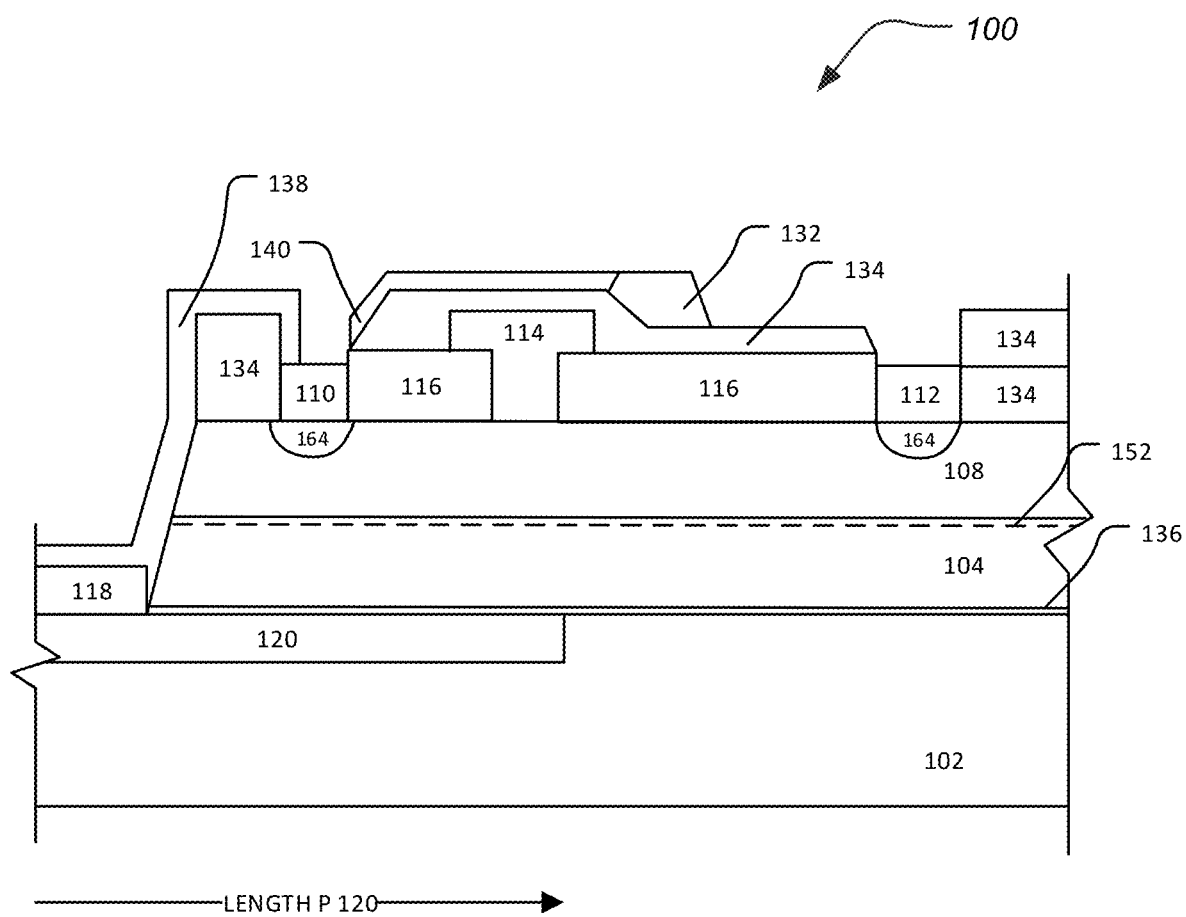
FIG. 8 shows a cross-sectional view of another aspect of a transistor according to the disclosure.

FIG. 8 shows a cross-sectional view of another aspect of a transistor according to the disclosure. In particular, FIG. 8 illustrates a transistor 100 that may include any one or more aspects of the disclosure described herein. In particular, the transistor 100 of FIG. 8 may include the p+ layer 106 (not shown in FIG. 8) as described above in relation to FIGS. 1-6. In other aspects, the transistor 100 of FIG. 8 may not utilize the p+ layer 106 as shown in FIG. 8. In one aspect of FIG. 8, the transistor 100 may be implemented with only the p+ layer 106. In one aspect of FIG. 8, the transistor 100 may be implemented with the p+ layer 106 and the p-type material layer 120. In one aspect of FIG. 8, the transistor 100 may be implemented with only the p-type material layer 120.

FIG. 8 further illustrates that the p-type material contact 118 may be electrically connected to the source 110 with a source interconnect 138. In one aspect, the source interconnect 138 may be formed on a spacer layer 134 to extend between the p-type material contact 118 and the source 110. In some aspects, the source interconnect 138 may include a conductive material, many different conductive materials, a suitable material being a metal or combinations of metals, deposited using standard metallization methods. In one aspect, the materials may include one or more of titanium, gold, nickel, or the like.

FIG. 8 further illustrates in greater detail the nucleation layer 136. The nucleation layer 136 may be formed on the substrate layer 102 to reduce a lattice mismatch between the substrate layer 102 and a next layer in the transistor 100. The nucleation layer 136 may include many different materials, with a suitable material being $Al_zGa_{1-z}N$ ($0<=z<=1$). The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like. In further aspects, there may be intervening layers between the nucleation layer 136 and the substrate layer 102. In further aspects, there may be intervening layers between the nucleation layer 136 and the buffer layer 104.

In one aspect, a non-conducting spacer layer 134 may be formed partially over the gate 114 between the source 110 and the drain 112. In one aspect, a non-conducting spacer layer 134 may be formed over the gate 114 between the source 110 and the drain 112. In one aspect, the spacer layer 134 may include a layer of non-conducting material such as a dielectric. In one aspect, the spacer layer 134 may include a number of different layers of dielectrics or a combination of dielectric layers. In one aspect, the spacer layer 134 may be many different thicknesses, with a suitable range of thicknesses being approximately 0.05 to 2 microns.

In one aspect, the spacer layer 134 may include a material such as a Group III nitride material having different Group III elements such as alloys of Al, Ga, or In, with a suitable spacer layer material being $Al_xGa_{1-x}N$ (0<x<1).

In one aspect, the barrier layer 108 may include a region 164 under the source 110 and/or drain 112 that is a N+ material. In one aspect, the barrier layer 108 may include a region 164 under the source 110 and/or drain 112 that is Si doped.

FIG. 8 further illustrates details of the field plate 132. In one aspect, the field plate 132 may be arranged on the spacer layer 134 between the gate 114 and drain 112. In one aspect, the field plate 132 may be deposited on the spacer layer 134 between the gate 114 and the drain 112. In some aspects, the field plate 132 may be adjacent the gate 114 and an additional spacer layer 134 of dielectric material may be included at least partially over the gate 114 to isolate the gate 114 from the field plate 132. In some aspects, the field plate 132 may overlap the gate 114 and an additional spacer layer 134 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In some aspects, the field plate 132 may be electrically connected to the source 110 with a source—field plate interconnect 140. In one aspect, the source—field plate interconnect 140 may be formed on the spacer layer 134 to extend between the field plate 132 and the source 110. In one aspect, the source—field plate interconnect 140 may be formed with the field plate 132 during the same manufacturing step. In one aspect, a plurality of the source—field plate interconnects 140 may be used. In one aspect, a plurality of the field plates 132 may be used. In one aspect, a plurality of the field plates 132 may be used and each of the plurality of field plates 132 may be stacked with a dielectric material therebetween. In some aspects, the source—field plate interconnect 140 may include a conductive material, many different conductive materials, a suitable material being a metal, or combinations of metals, deposited using standard metallization methods. In one aspect, the materials may include one or more of titanium, gold, nickel, or the like.

In one aspect, the field plate 132 may be formed on the spacer layer 134 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In one aspect, the field plate 132 may be electrically connected to the source 110 through a conductive path that runs outside of the active regions of the transistor 100, the field plate 132, and/or the source 110. In some aspects, the conductive path may run outside the active area of the transistor 100 on the side of the gate 114, or the transistor 100 and may include two or more conductive paths running out the same or different sides of the transistor 100. In some aspects, after deposition of the field plate 132 and its connection to the source 110, the active structure can be covered by a dielectric passivation layer (not shown), such as silicon nitride.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

FIG. 8 further illustrates the heterointerface 152 between the barrier layer 108 and the buffer layer 104. In one aspect, the source 110 and the drain 112 electrodes may be formed making ohmic contacts such that an electric current flows between the source 110 and the drain 112 electrodes via a two-dimensional electron gas (2DEG) induced at the heterointerface 152 between the buffer layer 104 and barrier layer 108 when a gate 114 electrode is biased at an appropriate level. In one aspect, the heterointerface 152 may be in the range of 0.005 μm to 0.007 μm, 0.007 μm to 0.009 μm, and 0.009 μm to 0.011 μm.

Figure 9:
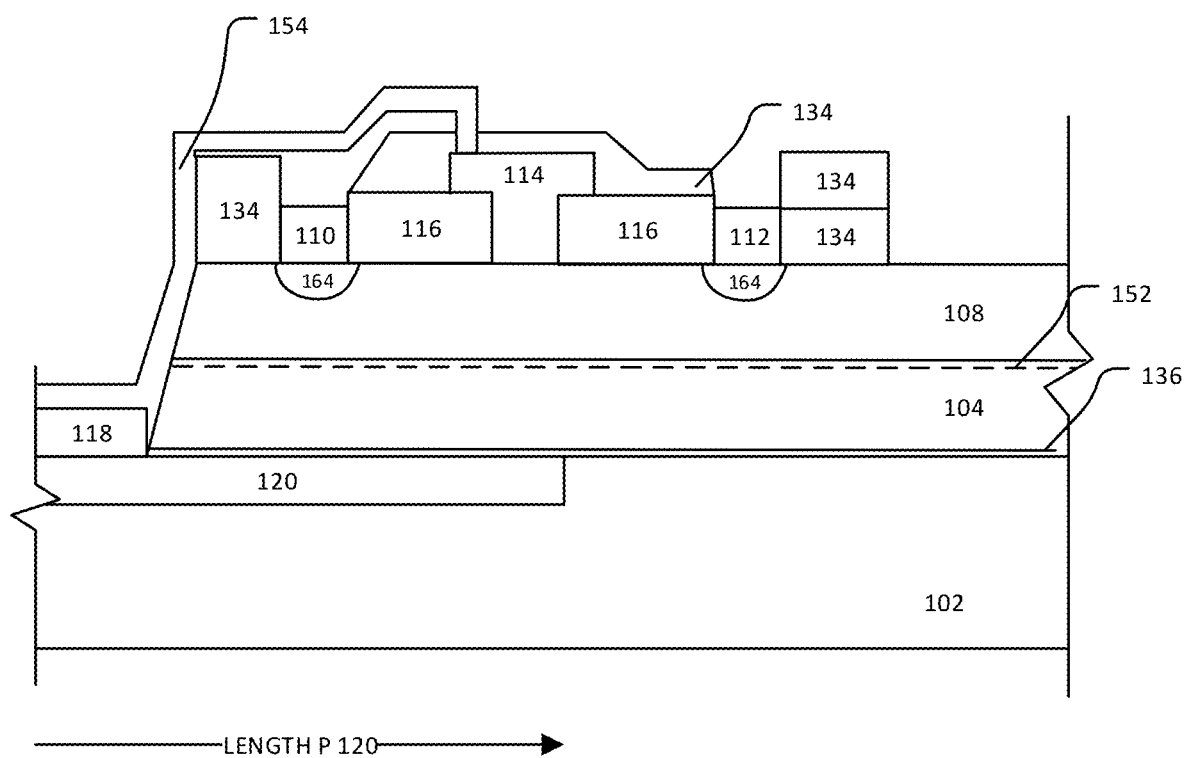
FIG. 9 shows a cross-sectional view of another aspect of a transistor according to the disclosure.

FIG. 9 shows a cross-sectional view of another aspect of a transistor according to the disclosure. In particular, FIG. 9 illustrates a transistor 100 that may include any one or more aspects of the disclosure described herein. In particular, in some aspects the transistor 100 of FIG. 9 may include the p+ layer 106 (not shown in FIG. 9) as described above in relation to FIGS. 1-6. Other aspects may not utilize the p+ layer 106. In one aspect of FIG. 9, the transistor 100 may be implemented with only the p+ layer 106. In one aspect of FIG. 9, the transistor 100 may be implemented with the p+ layer 106 and the p-type material layer 120. In one aspect of FIG. 9, the transistor 100 may be implemented with only the p-type material layer 120.

In various aspects, use of buried p-layers, such as the p+ layer 106 and/or the p-type material layer 120 may be beneficial for the transistor 100 implemented as HEMTs for RF applications to obtain high breakdown voltage and good isolation between the input and output.

However, in some applications, such as RF switch applications, the buried p-layer may not be connected to the source 110 as described herein. In this regard, a forward bias conduction between the p-layer (the p+ layer 106 and/or the p-type material layer 120) and the drain 112 may cause a loss of input-output isolation when the transistor 100 is in the OFF condition. To avoid, minimize, and/or limit this problem, aspects illustrated in FIG. 9 of this disclosure may include connecting the buried p-layer (the p+ layer 106 and/or the p-type material layer 120) to the gate 114.

In particular, FIG. 9 further illustrates that the p-type material contact 118 may be electrically connected to the gate 114 with a gate interconnect 154. In one aspect, the gate interconnect 154 may be formed on the spacer layer 134 to extend between the p-type material contact 118 and the gate 114. In some aspects, the gate interconnect 154 may include a conductive material, many different conductive materials, a suitable material being a metal, or combinations of metals, deposited using standard metallization methods. In one aspect, the materials may include one or more of titanium, gold, nickel, or the like.

In some aspects, the source 110 and the drain 112 may be symmetrical with respect to the gate 114. In some switch device application aspects, the source 110 and the drain 112 may be symmetrical with respect to the gate 114.

An additional advantage of the FIG. 9 configuration may be that the p-layer may be used as a second gate, which allows use of multiple barrier layers 108 and/or multiple channel layers. In this regard, multiple barrier layers 108 and/or multiple channel layers may reduce the on-resistance of the transistor 100, an important performance characteristic. In further aspects of FIG. 9, the reduced on-resistance may be obtained without significantly increasing an input-output capacitance, another important characteristic. In certain aspects, the FIG. 9 configuration may enable reduction of Ron-Coff product, an important figure-of-merit for RF switches.

FIG. 9 further illustrates the heterointerface 152 between the barrier layer 108 and the buffer layer 104. In one aspect, the 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the heterointerface 152 may be in the range of 0.005 μm to 0.007 μm, 0.007 μm to 0.009 μm, and 0.009 μm to 0.011 μm.

Figure 10:
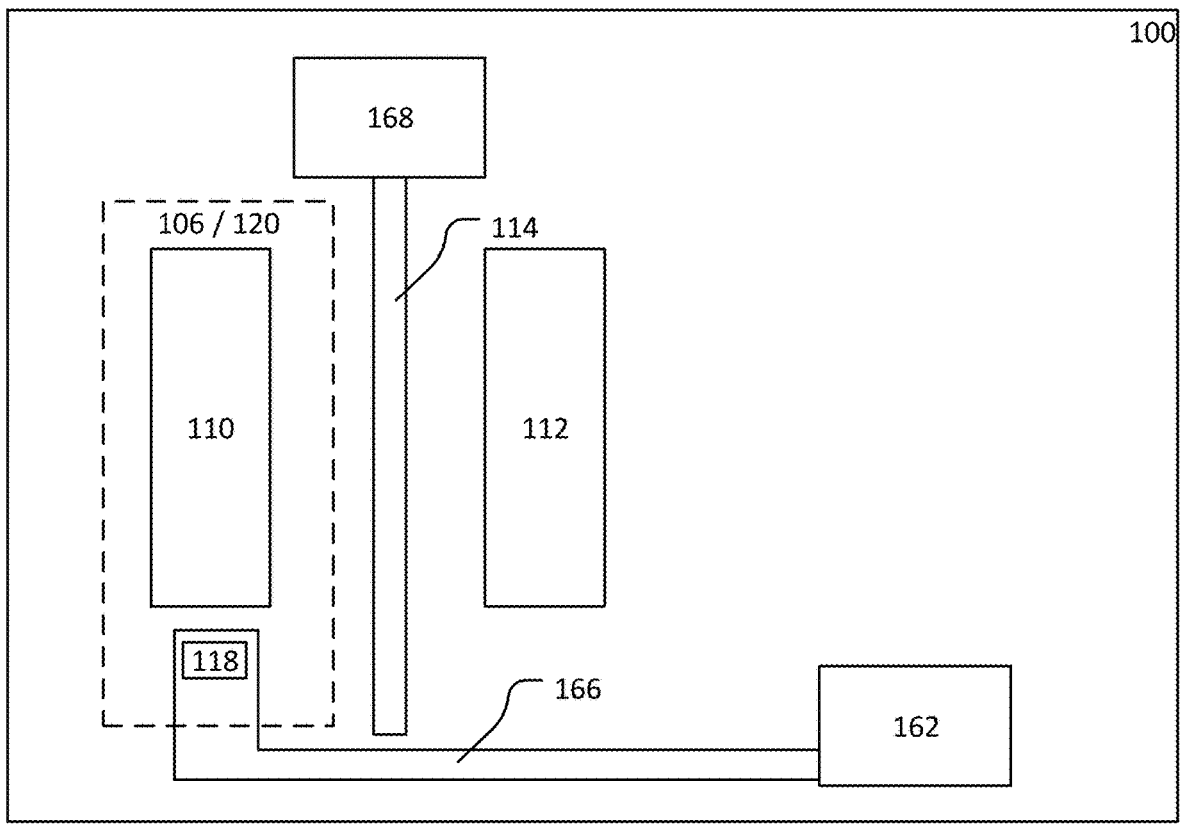
FIG. 10 shows a plan view of another aspect of a transistor according to the disclosure.

FIG. 10 shows a partial plan view of another aspect of a transistor according to the disclosure. In particular, FIG. 10 illustrates a transistor 100 that may include any one or more aspects of the disclosure described herein. In particular, in some aspects the transistor 100 of FIG. 10 may be configured such that the p-layer may be provided with a separate contact 162 and may be configured to receive its own bias and signals. In this way, the p-layer can be used to modulate the characteristics of the transistor 100.

FIG. 10 further illustrates the transistor 100 including the source 110, the gate 114, and the drain 112. In this regard, some of the various layers and components of the transistor 100 may not be shown for clarity of understanding.

In one aspect of FIG. 10, the transistor 100 may be implemented with only the p+ layer 106. In one aspect of FIG. 10, the transistor 100 may be implemented with the p+ layer 106 and the p-type material layer 120. In one aspect of FIG. 10, the transistor 100 may be implemented with only the p-type material layer 120. In each case, the p+ layer 106 and the p-type material layer 120 are shown with a dashed line indicative of the layer or layers being buried.

In one aspect, the p-type material layer 120 may be provided with a contact pad 162. In this aspect, the p-type material layer 120 through the contact pad 162 may receive its own bias and signals. In this regard, the p-type material layer 120 may be used to modulate characteristics of the transistor 100.

In one aspect, the p-type material layer 120 may be provided with the p-type material contact 118. The p-type material contact 118 may be electrically connected to a connection 166 that may be electrically connected to a contact pad 162. In some aspects, the connection 166 may include a conductive material, many different conductive materials, a suitable material being a metal, or combinations of metals, deposited using standard metallization methods. In one aspect, the materials may include one or more of titanium, gold, nickel, or the like.

In one aspect, the p+ layer 106 may be provided with a contact pad 162. In this aspect, the p+ layer 106 through the contact pad 162 may receive its own bias and signals. In this regard, the contact pad 162 may be used to modulate characteristics of the transistor 100.

In one aspect, the p+ layer 106 may be provided with the p-type material contact 118. The p-type material contact 118 may be electrically connected to a connection 166 that may be electrically connected to a contact pad 162.

In one aspect, the connection 166 may be a metallic connection that extends from the p-type material contact 118 to the contact pad 162. In one aspect, the contact pad 162 may be a buried contact pad. In this regard, the contact pad 162 may be buried in any one of the above-noted structures of the transistor 100. FIG. 10 further illustrates a gate pad 168 that is electrically connected to the gate 114. It should be noted that the size, arrangement, and configuration of the p-type material contact 118, the connection 166, the contact pad 162, the p+ layer 106, the p-type material layer 120, and the like illustrated in FIG. 10 is merely exemplary. Others sizes, arrangements, and configurations are contemplated as well.

Figure 11:
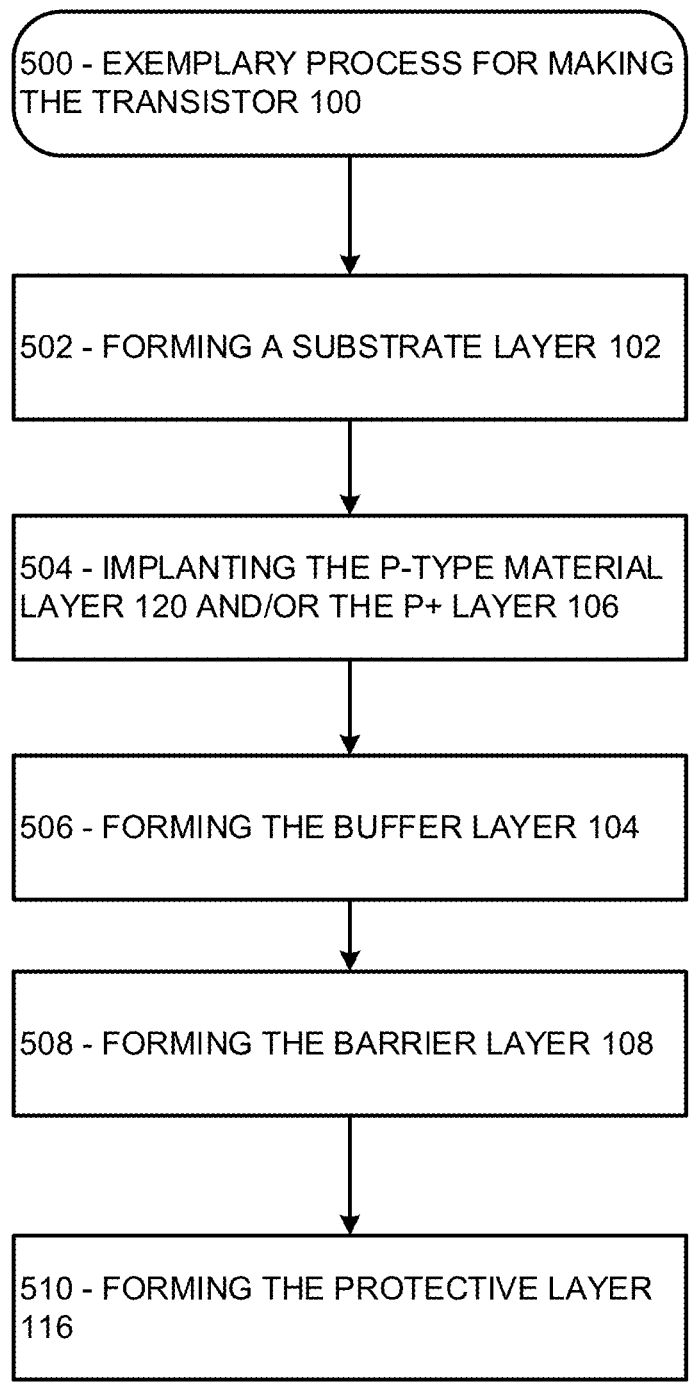
FIG. 11 shows a process for making a transistor according to the disclosure.

FIG. 11 shows a process for making a transistor according to the disclosure. In particular, FIG. 11 shows an exemplary process 500 for making the transistor 100 of FIGS. 1-10. It should be noted that the process 500 is merely exemplary and may be modified consistent with the various aspects disclosed herein.

The process 500 may begin at step 502 by forming a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be 1E15/cm$^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

In a first aspect directed to the transistor 100 of FIG. 1 and FIG. 2, the process 500 may include a step 504 of implanting Al into the substrate layer 102 to form the p-type material layer 120 in the substrate layer 102 as shown, for example, in FIG. 1 and FIG. 2. The p-type material layer 120 may be formed by ion implantation of Al and annealing. In one aspect, the p-type material layer 120 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implantation efficiency. In some aspects, the process 500 may further include implanting Al into the substrate layer 102 to form the p+ layer 106 in the substrate layer 102 as shown, for example, in FIG. 1 and FIG. 2. Thereafter, the substrate layer 102 may be annealed as defined herein. In one aspect, the p-type material layer 120 may be formed by ion implantation of $^{27}$Al in 4H-SiC implanted with channeling conditions with an implant energy of $E_1$=100 keV with a dose of 1E13 cm$^2$ at 25° C. In one aspect, the p-type material layer 120 may be formed by ion implantation of $^{27}$Al in 4H-SiC implanted with channeling conditions with an implant energy of $E_2$=300 keV with a dose of 1E13 cm$^2$ at 25° C. However, other implant energies and doses are contemplated as well.

In the first aspect directed to the transistor 100 of FIG. 1 and FIG. 2, the buffer layer 104 may be formed at step 506 on the substrate layer 102. The buffer layer 104 may be grown or deposited on the substrate layer 102. In one aspect, the buffer layer 104 may be GaN. In another aspect, the buffer layer 104 may be formed with LEO. In one aspect, a nucleation layer may be formed on the substrate layer 102 and the buffer layer 104 may be formed at step 506 on the nucleation layer 136. The buffer layer 104 may be grown or deposited on the nucleation layer 136. In one aspect, the buffer layer 104 may be GaN. In another aspect, the buffer layer 104 may be formed with LEO.

In a second aspect directed to the transistor 100 of FIG. 3 and FIG. 4, the process 500 may include a step 504 forming the epitaxial layer 202 on the substrate layer 102. Thereafter, the epitaxial layer 202 may be removed, etched, damaged, and/or the like to form the p-type material layer 120 in the epitaxial layer 202 as shown in FIG. 3 and FIG. 4.

In the second aspect directed to the transistor 100 of FIG. 3 and FIG. 4, the buffer layer 104 may be formed at step 506 on the epitaxial layer 202. The buffer layer 104 may be grown or deposited on the epitaxial layer 202. In one aspect, the buffer layer 104 may be GaN. In another aspect, the buffer layer 104 may be formed with LEO.

At step 508, the barrier layer 108 may be formed on the buffer layer 104. The barrier layer 108 may be an n-type conductivity layer or may be undoped. In one aspect, the barrier layer 108 may be AlGaN.

At step 510, the protective layer 116 may be formed. The protective layer 116 may be a passivation layer, such as SiN, AlO, SiO, $SiO_2$, AlN, or the like, or a combination incorporating multiple layers thereof, which may be deposited over the exposed surface of the barrier layer 108. In another aspect of the disclosure, to create a place for contact with the p-type material layer 120, a recess may be created by removing at least part of the barrier layer 108 and at least part of the buffer layer 104. The recess may remove any material above the p-type material layer 120 within a portion of a region associated with the source 110, exposing the p-type material layer 120 on a side opposite of the substrate layer 102. In another aspect of the disclosure, to create a place for contact with the p+ layer 106, a recess may be created by removing at least part of the barrier layer 108 and at least part of the buffer layer 104. The recess may remove any material above the p+ layer 106 within a portion of a region associated with the source 110, exposing the p+ layer 106 on a side opposite of the substrate layer 102.

Further during the process 500, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110, may include Al, Ti, Si, Ni, and/or Pt. In one aspect, a region 164 under the source 110 that is a N+ material may be formed in the barrier layer 108. In one aspect, a region 164 under the drain 112 may be Si doped.

Further during the process 500, the drain 112 may be arranged on the barrier layer 108. Like the source 110, the drain 112 may be may be an ohmic contact of Ni or another suitable material, and may also be annealed in a similar fashion. In one aspect, an n+ implant may be used in conjunction with the barrier layer 108 and the contacts are made to the implant. In one aspect, a region 164 under the drain 112 that is a N+ material may be formed in the barrier layer 108. In one aspect, a region 164 under the drain 112 may be Si doped.

Further during the process 500, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

Further during the process 500 the p-type material contact 118 may be formed. Once the p+ layer 106 is exposed, nickel or another suitable material may be evaporated to deposit the p-type material contact 118. The nickel or another suitable material may be annealed to form an ohmic contact, for example. In some aspects, the contacts of the p-type material contact 118 may include Al, Ti, Si, Ni, and/or Pt. Such a deposition and annealing process may be carried out utilizing conventional techniques known to those of skill in the art. For example, an ohmic contact for the p-type material contact 118 may be annealed at a temperature of from about 600° C. to about 1050° C. Once the p-type material contact 118 has been formed on the p+ layer 106, a metal overlayer may electrically couple the p-type material contact 118 of the p+ layer 106 to the source 110. Doing this may maintain the conductivity of the p+ layer 106 and the source 110 at the same potential.

The source 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the heterointerface 152 may be in the range of 0.005 μm to 0.007 μm, 0.007 μm to 0.009 μm, and 0.009 μm to 0.011 μm.

The gate 114 may extend on top of a spacer or the protective layer 116. The protective layer 116 may be etched and the gate 114 deposited such that the bottom of the gate 114 is on the surface of barrier layer 108. The metal forming the gate 114 may be patterned to extend across protective layer 116 so that the top of the gate 114 forms a field plate 132.

Further during some aspects of the process 500, a field plate 132 may be arranged on top of another protective layer and may be separated from the gate 114. In one aspect, the field plate 132 may be deposited on the spacer layer 134 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like. In one aspect, the source—field plate interconnect 140 may be formed with the field plate 132 during the same manufacturing step. In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer 134 such as silicon nitride. The dielectric spacer layer 134 may also be implemented similar to the protective layer 116. Moreover, it should be noted that the cross-sectional shape of the gate 114, shown in FIGS. 1-6 is exemplary. For example, the cross-sectional shape of the gate 114 in some aspects may not include the T-shaped extensions. Other constructions of the gate 114 may be utilized, for example, the construction of the gate 114 illustrated in FIG. 7.

Further during some aspects of the process 500, the gate interconnect 154 may be formed. In one aspect, the gate interconnect 154 may be formed to extend between the p-type material contact 118 and the gate 114. In one aspect, the gate interconnect 154 may be formed on the spacer layer 134 to extend between the p-type material contact 118 and the gate 114.

Further during some aspects of the process 500, the source—field plate interconnect 140 may be formed. In some aspects, the field plate 132 may be electrically connected to the source 110 with the source—field plate interconnect 140. In one aspect, the source—field plate interconnect 140 may be formed on the spacer layer 134 to extend between the field plate 132 and the source 110.

Further during some aspects of the process 500, the connection 166 and the contact at 162 may be formed. In one aspect, the p-type material contact 118 may be electrically connected to the connection 166 that may be electrically connected to a contact pad 162. Further during some aspects of the process 500, the gate pad 168 may be formed.

It should be noted that the steps of process 500 may be performed in a different order consistent with the aspects described above. Moreover, the process 500 may be modified to have more or fewer process steps consistent with the various aspects disclosed herein. In one aspect of the process 500, the transistor 100 may be implemented with only the p+ layer 106. In one aspect of the process 500, the transistor 100 may be implemented with the p+ layer 106 and the p-type material layer 120. In one aspect of the process 500, the transistor 100 may be implemented with only the p-type material layer 120.

Figure 12:
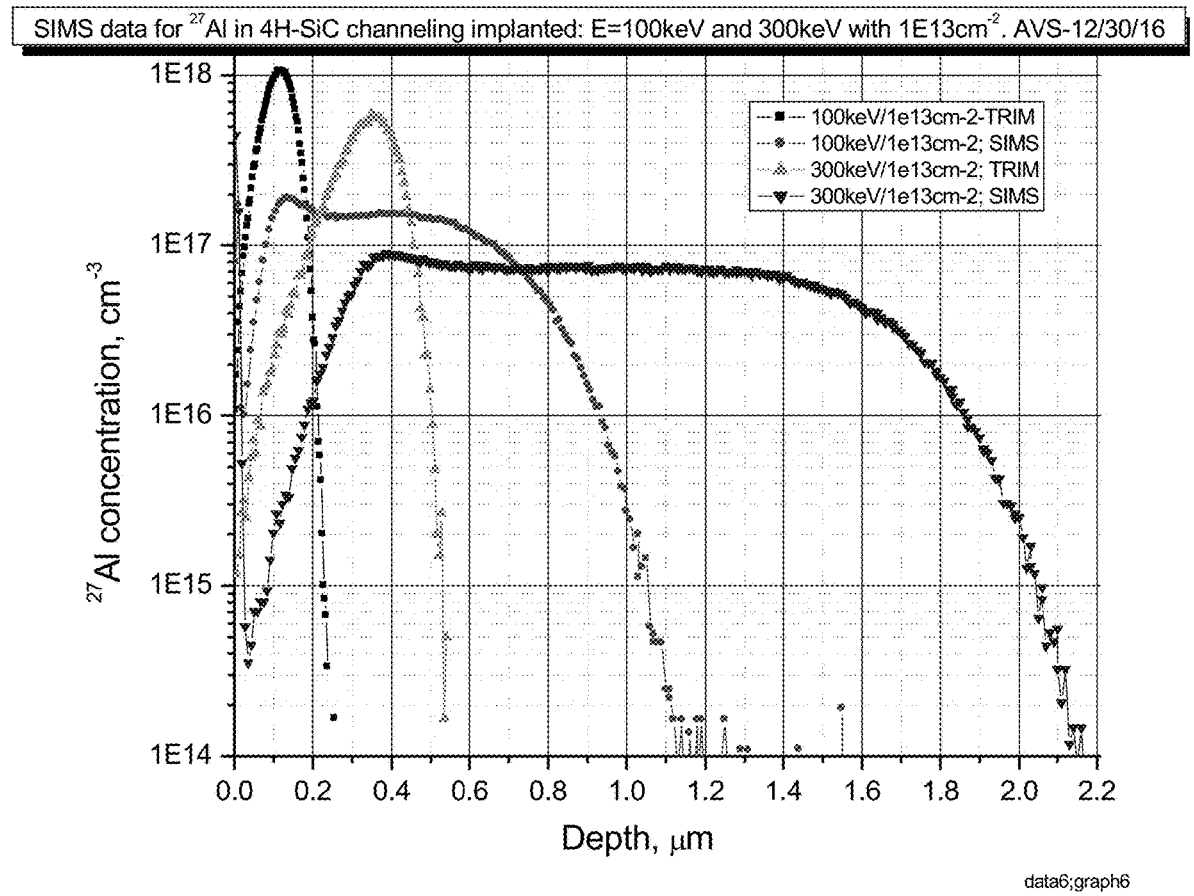
FIG. 12 illustrates a distribution of Al implanted with channeling conditions according to aspects of the disclosure in comparison to simulations for conventional implant conditions.

FIG. 12 illustrates a distribution of Al implanted with channeling conditions according to aspects of the disclosure in comparison to simulations for conventional implant conditions. In particular FIG. 12 illustrates a distribution of $^{27}$Al in 4H-SiC implanted with channeling conditions along C-axis (secondary ion mass spectrometry (SIMS) data) in comparison with simulations for conventional implant conditions (TRIM) off axis. The implant energy utilized was $E_1$=100 keV and $E_2$=300 keV with a dose of 1E13 cm$^{-2}$ at 25° C. In this regard, the p-type material layer 120 may be implanted consistent with this implant energy and dose. However, other implant energies and doses are contemplated as well as described herein.

In one aspect, the p-type material layer 120 may have a doping concentration less than the p+ layer 106. In one aspect, p+ layer 106 may be doped as highly as possible with minimum achievable sheet resistance. In one aspect, the p-type material layer 120 may have an implantation concentration less than the p+ layer 106. In one aspect, p+ layer 106 may have an implantation concentration as high as possible with minimum achievable sheet resistance. In one aspect, the p-type material layer 120 may have an implantation concentration less than $10^{19}$. In one aspect, the p-type material layer 120 may have an implantation concentration less than $10^{20}$. In one aspect, the p-type material layer 120 may have an implantation concentration of $10^{17}$-$10^{20}$, $10^{19}$-$10^{20}$, $10^{18}$-$10^{19}$, or $10^{17}$-$10^{18}$. In one aspect, the p+ layer 120 may have an implantation concentration $10^{19}$ or greater. In one aspect, the p+ layer 120 may have an implantation concentration of $10^{18}$-$10^{20}$, $10^{18}$-$10^{19}$, or $10^{19}$-$10^{20}$.

In one aspect, the p-type material layer 120 doping may be less than 1E17 cm$^3$. In one aspect, the p-type material layer 120 doping may be less than 2E17 cm$^3$. In one aspect, the p-type material layer 120 doping may be less than 6E17 cm$^3$. In one aspect, the p-type material layer 120 doping may be less than 2E18 cm$^3$. In one aspect, the p-type material layer 120 doping may be in the range of 5E15 to 5E17 per cm$^3$. In these aspects, the p+ layer 106 doping concentration may be greater than a doping concentration of the p-type material layer 120.

Accordingly, the disclosure has set forth a simpler alternative solution to forming p-type layers in HEMTs. The disclosed structure can be readily fabricated with currently available techniques. Moreover, the disclosed use of a high-purity material minimizes drain lag effects. Additionally, the disclosed p-type material layer provides a retarding electric field to obtain good electron confinement with low leakage. Additionally, aspects of this disclosure have described in detail variations of transistors with p-type layers and the ways those p-type layers are formed. The disclosed transistors maximize RF power, allow for efficient discharge, and maximize breakdowns.

According to further aspects of this disclosure, transistors, such as GaN HEMTs, fabricated on high resistivity substrates may be utilized for high power RF (radio frequency) amplifiers, for high power radiofrequency (RF) applications, and also for low frequency high power switching applications. The advantageous electronic and thermal properties of GaN HEMTs also make them very attractive for switching high power RF signals. In this regard, the disclosure has described a structure with a buried p-layer under the source region to obtain high breakdown voltage in HEMTs for various applications including power amplifiers while at the same time eliminating drifts in device characteristics arising from trapping in the buffer and/or semi-insulating substrates. Use of buried p-layers may also be important in HEMTs for RF switches to obtain high breakdown voltage and good isolation between the input and output.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An apparatus, comprising:
    a substrate;
    a group III-Nitride buffer layer on the substrate;
    a group III-Nitride barrier layer on the group III-Nitride buffer layer, the group III-Nitride barrier layer comprising a higher bandgap than a bandgap of the group III-Nitride buffer layer;
    a source electrically coupled to the group III-Nitride barrier layer;
    a gate electrically coupled to the group III-Nitride barrier layer;
    a drain electrically coupled to the group III-Nitride barrier layer; and
    a p-region in or on the substrate below said group III-Nitride barrier layer,
    wherein the gate is electrically coupled to said p-region.

2. The apparatus of claim 1, further comprising an interconnect configured to couple the gate to said p-region.

3. The apparatus of claim 1, further comprising a field plate.

4. The apparatus of claim 1, further comprising a contact electrically coupled to said p-region.

5. The apparatus of claim 1, further comprising a nucleation layer on the substrate, wherein the group III-Nitride buffer layer is on the nucleation layer.

6. The apparatus of claim 5, further comprising intervening layers between the nucleation layer and the group III-Nitride buffer layer.

7. The apparatus of claim 1, wherein a length of the p-region being less than an entire length of the substrate.

8. The apparatus of claim 1,
wherein the p-region is provided in the substrate; and
wherein the p-region comprises aluminum implanted in the substrate.

9. The apparatus of claim 1,
wherein the p-region is provided in a layer arranged on the substrate;
wherein the layer is an epitaxial layer; and
wherein the layer is at least one of the following: GaN or SiC.

10. A method of making a device comprising:
providing a substrate;
providing a group III-Nitride buffer layer on the substrate;
providing a group III-Nitride barrier layer on the group III-Nitride buffer layer, the group III-Nitride barrier layer comprising a higher bandgap than a bandgap of the group III-Nitride buffer layer;
electrically coupling a source to the group III-Nitride barrier layer;
electrically coupling a gate to the group III-Nitride barrier layer;
electrically coupling a drain to the group III-Nitride barrier layer;
providing a p-region in or on the substrate below said group III-Nitride barrier layer; and
coupling an interconnect from the gate to said p-region.

11. The method of claim 10, further comprising providing a field plate.

12. The method of claim 10, further comprising arranging a contact and electrically coupling the contact to said p-region.

13. The method of claim 10, further comprising providing a nucleation layer on the substrate, wherein the group III-Nitride buffer layer is on the nucleation layer.

14. The method of claim 10, wherein the p-region is provided in the substrate; and
the method further comprises implanting aluminum in the substrate to form the p-region.

15. The method of claim 10,
wherein the p-region is provided in a layer arranged on the substrate;
wherein the layer is an epitaxial layer; and
wherein the layer is at least one of the following: GaN or SiC.

16. The apparatus of claim 1, wherein the source is electrically coupled to said p-region.

17. The apparatus of claim 3, wherein the field plate is connected to the source.

18. The method of claim 10, further comprising electrically coupling the source to said p-region.

19. The method of claim 11, further comprising connecting the field plate to the source.

20. The apparatus of claim 2, further comprising a field plate.

21. The apparatus of claim 20, wherein the field plate is connected to the source.

* * * * *